US010991407B1

United States Patent
Prasad et al.

(10) Patent No.: US 10,991,407 B1
(45) Date of Patent: Apr. 27, 2021

(54) MAGNETORESISTIVE MEMORY DEVICE INCLUDING A HIGH DIELECTRIC CONSTANT CAPPING LAYER AND METHODS OF MAKING THE SAME

(71) Applicant: WESTERN DIGITAL TECHNOLOGIES, INC., San Jose, CA (US)

(72) Inventors: Bhagwati Prasad, San Jose, CA (US); Matthew Carey, San Jose, CA (US); Alan Kalitsov, San Jose, CA (US); Bruce Terris, Sunnyvale, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/692,903

(22) Filed: Nov. 22, 2019

(51) Int. Cl.
*G11C 11/16* (2006.01)
*H01L 27/22* (2006.01)
*H01L 43/08* (2006.01)
*H01L 43/10* (2006.01)

(52) U.S. Cl.
CPC ........ *G11C 11/161* (2013.01); *G11C 11/1675* (2013.01); *G11C 11/1697* (2013.01); *H01L 27/222* (2013.01); *H01L 43/08* (2013.01); *H01L 43/10* (2013.01)

(58) Field of Classification Search
CPC .................................................. G11C 11/161
See application file for complete search history.

(56) References Cited

U.S. PATENT DOCUMENTS

| 8,946,834 B2 * | 2/2015 | Wang ..................... G11C 11/161 |
| | | 257/421 |
| 8,981,505 B2 | 3/2015 | Moriyama et al. |
| 9,159,907 B2 | 10/2015 | Tang et al. |
| 9,177,575 B1 * | 11/2015 | Gao ....................... G11B 5/3912 |
| 9,396,742 B1 | 7/2016 | Yang et al. |
| 10,354,710 B2 | 7/2019 | Petti et al. |
| 10,580,966 B1 | 3/2020 | Van Der Straten et al. |
| 2006/0174473 A1 * | 8/2006 | Oh ........................... G11C 11/16 |
| | | 29/603.08 |
| 2011/0049659 A1 * | 3/2011 | Suzuki .................. B82Y 25/00 |
| | | 257/421 |
| 2012/0218813 A1 | 8/2012 | Oh et al. |
| 2012/0300542 A1 * | 11/2012 | Uchida ................. H01L 27/226 |
| | | 365/171 |
| 2013/0146996 A1 | 6/2013 | Yu et al. |

(Continued)

FOREIGN PATENT DOCUMENTS

| WO | WO2014022304 A1 | 2/2014 |
| WO | WO 2017/151735 A1 | 9/2017 |
| WO | WO2018-004648 A1 | 1/2018 |

OTHER PUBLICATIONS

USPTO Office Communication, Non-Final Office Action for U.S. Appl. No. 16/693,006, dated Oct. 30, 2020, 22 pages.

(Continued)

*Primary Examiner* — Douglas King
(74) *Attorney, Agent, or Firm* — The Marbury Law Group PLLC

(57) ABSTRACT

Magnetoelectric or magnetoresistive memory cells include at least one of a high dielectric constant dielectric capping layer and/or a nonmagnetic metal dust layer located between the free layer and the dielectric capping layer.

19 Claims, 9 Drawing Sheets

(56) References Cited

U.S. PATENT DOCUMENTS

| | | | |
|---|---|---|---|
| 2013/0249028 A1* | 9/2013 | Kamata | H01L 43/08 257/427 |
| 2014/0306302 A1 | 10/2014 | Jan et al. | |
| 2015/0228891 A1* | 8/2015 | Park | H01L 43/08 257/421 |
| 2015/0285957 A1 | 10/2015 | Scherer | |
| 2016/0351799 A1 | 12/2016 | Xue et al. | |
| 2017/0092842 A1 | 3/2017 | Khalili Amiri et al. | |
| 2017/0117027 A1 | 4/2017 | Braganca et al. | |
| 2017/0287979 A1 | 10/2017 | Manipatruni et al. | |
| 2017/0338403 A1 | 11/2017 | Kim et al. | |
| 2019/0027169 A1 | 1/2019 | Xue et al. | |
| 2019/0027201 A1 | 1/2019 | Petti et al. | |
| 2019/0080738 A1 | 3/2019 | Choi et al. | |
| 2019/0221575 A1 | 7/2019 | Dong et al. | |
| 2019/0237661 A1 | 8/2019 | Iwata et al. | |
| 2020/0233047 A1 | 7/2020 | Kalitsov et al. | |

OTHER PUBLICATIONS

Notification of Transmittal of the International Search Report and Written Opinion of the International Search Authority for International Patent Application No. PCT/US2020/025989, dated Aug. 24, 2020, 17 pages.

Gonzalez-Fuentes, C. et al., "Theory of Ferromagnetic Resonance Driven by the Combined Action of Spin-Transfer Torque and Voltage-Controlled Magnetic Anisotropy," Phys. Rev. B 96, 174440—Published Nov. 27, 2017 (Abstract).

U.S. Appl. No. 16/182,867, filed Nov. 7, 2018, SanDisk Technologies LLC.

U.S. Appl. No. 16/212,132, filed Dec. 6, 2018, SanDisk Technologies LLC.

U.S. Appl. No. 16/212,257, filed Dec. 6, 2018, SanDisk Technologies LLC.

U.S. Appl. No. 16/212,342, filed Dec. 6, 2018, SanDisk Technologies LLC.

U.S. Appl. No. 16/212,420, filed Dec. 6, 2018, SanDisk Technologies LLC.

U.S. Appl. No. 16/250,403, filed Jan. 17, 2019, SanDisk Technologies LLC.

USPTO Office Communication, Non-Final Office Action for U.S. Appl. No. 16/692,965, dated Aug. 3, 2020, 22 pages.

Robertson, J., "High Dielectric Constant Gate Oxides for Metal Oxide Si Transistors," Reports on Progress in Physics, Table-2, pp. 327, 335, (2006).

Kalitsov, A. et al., "Spin-transfer torque in magnetic tunnel junctions," Phys. Rev. B. 79, 174416 (2009).

Gonzalez-Fuentes, C. et al., "Theory of Ferromagnetic Resonance Driven by the Combined Action of Spin-Transfer Torque and Voltage-Controlled Magnetic Anisotropy," Phys. Rev. B 96, 174440— (2017).

Prasad, B. et al., "Magnetoresistive Memory Device Including a High Dielectric Constant Capping Layer and Methods of Making the Same," U.S. Appl. No. 16/692,965, filed Nov. 22, 2019.

Prasad, B. et al., "Magnetoresistive Memory Device Including a High Dielectric Constant Capping Layer and Methods of Making the Same," U.S. Appl. No. 16/693,006, filed Nov. 22, 2019.

* cited by examiner

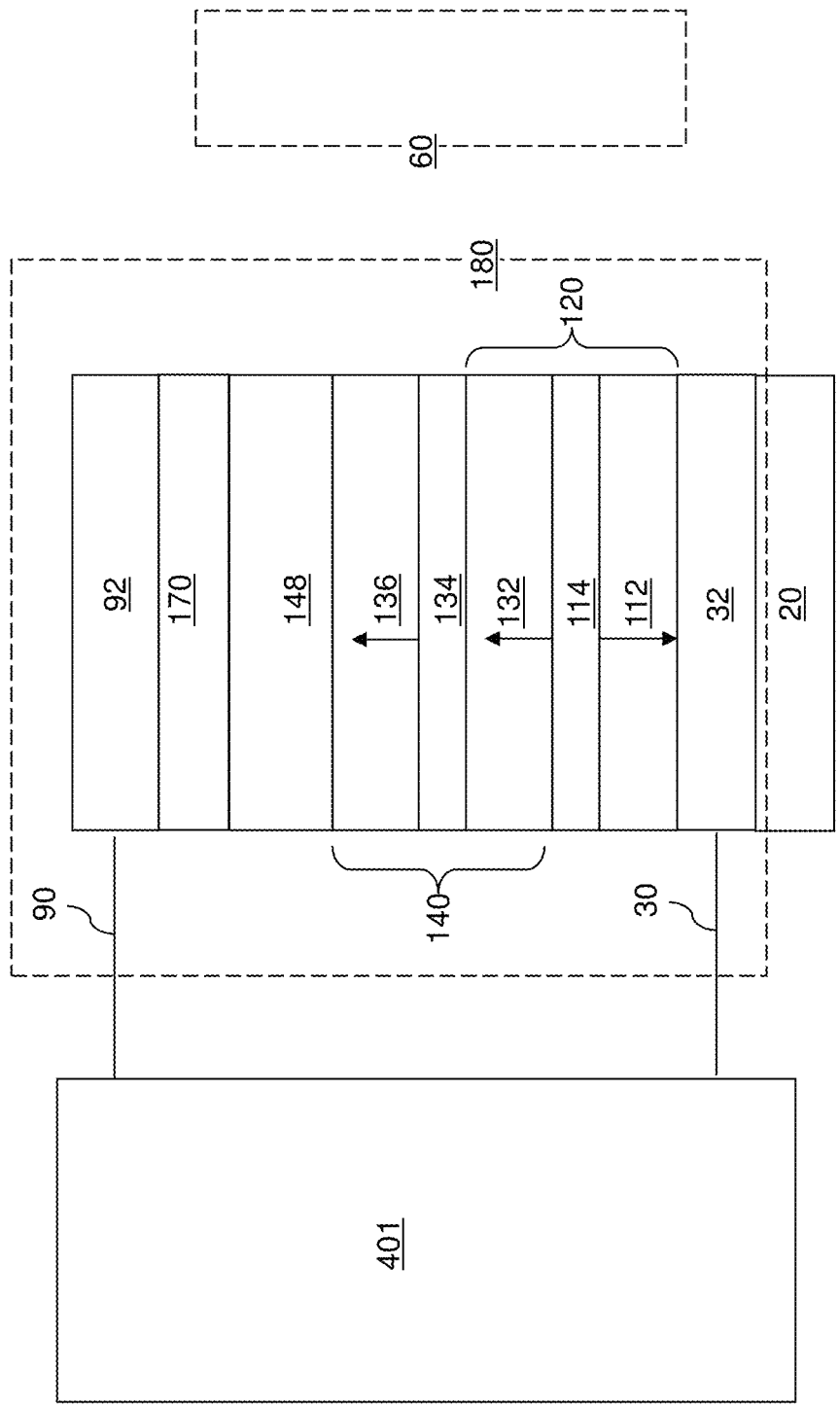

MAGNETORESISTIVE MEMORY DEVICE INCLUDING A HIGH DIELECTRIC CONSTANT CAPPING LAYER AND METHODS OF MAKING THE SAME

FIELD

The present disclosure relates generally to the field of magnetic memory devices and specifically to magnetoresistive memory devices including a high dielectric constant dielectric capping layer and/or a nonmagnetic metal dust layer.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing a torque on the magnetization of the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell depending if the magnetization of the free layer is parallel or antiparallel to the magnetization of the polarizer layer, also known as a reference layer.

SUMMARY

In a first embodiment, a voltage controlled magnetic anisotropy (VCMA) magnetoelectric memory device comprising a VCMA magnetoelectric memory cell is provided, wherein the VCMA magnetoelectric memory cell comprises a first electrode, a second electrode that is spaced from the first electrode, a magnetic tunnel junction located between the first electrode and the second electrode, the magnetic tunnel junction comprising a reference layer having a fixed magnetization direction, a free layer, and a nonmagnetic tunnel barrier layer located between the reference layer and the free layer, and a voltage controlled magnetic anisotropy (VCMA) dielectric capping layer having a dielectric constant greater than 10 and located between the free layer and the second electrode.

In one aspect of the first embodiment, a method of programming the VCMA magnetoelectric memory device comprises applying a first programming voltage of a first polarity between the first and the second electrodes to switch a first magnetization state of the free layer in which the free layer and the reference layer have parallel magnetization directions to a second magnetization state of the free layer in which the free layer and the reference layer have antiparallel magnetization directions.

In a second embodiment, a memory device comprises a first electrode, a second electrode, a magnetic tunnel junction located between the first electrode and the second electrode, the magnetic tunnel junction comprising a reference layer, a free layer, and a nonmagnetic tunnel barrier layer located between the reference layer and the free layer, a dielectric capping layer located between the second electrode and the free layer, and a nonmagnetic metal dust layer contacting the dielectric capping layer and the free layer.

In the fourth embodiment, a magnetoresistive memory device comprises a first electrode, a second electrode, a magnetic tunnel junction located between the first electrode and the second electrode, the magnetic tunnel junction comprising a reference layer, a free layer, and a nonmagnetic tunnel barrier layer located between the reference layer and the free layer, and a hafnium oxide layer located between the second electrode and the free layer.

In one aspect of the fourth embodiment, a method of operating an MRAM cell of the magnetoresistive memory includes programming the MRAM cell into a first programmed state by applying a positive programming voltage to the second electrode relative to the first electrode, such that a magnetization direction of the free layer is parallel to a magnetization direction of the reference layer; and programming the MRAM cell into a second programmed state by applying a negative programming voltage to the second electrode relative to the first electrode, such that the magnetization direction in the free layer is antiparallel to the magnetization direction of the reference layer.

BRIEF DESCRIPTION OF THE DRAWINGS

FIG. 2 illustrates a first exemplary a voltage-controlled magnetic anisotropy (VCMA) memory device including a voltage-controlled magnetic anisotropy dielectric capping layer according to a first embodiment of the present disclosure.

DETAILED DESCRIPTION

Figure 1:
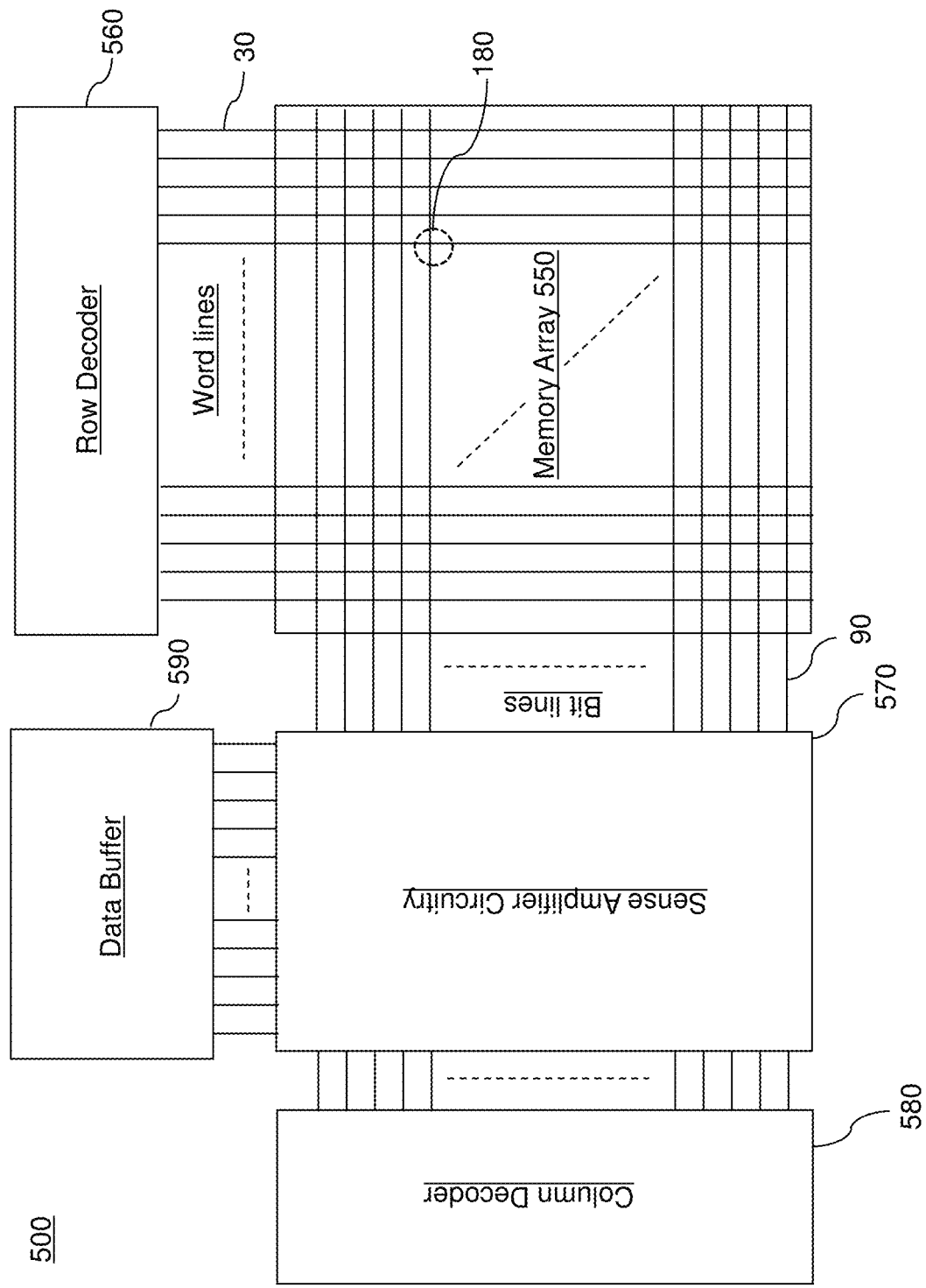
FIG. 1 is a schematic diagram of a memory device including an array of magnetoresistive or magnetoelectric memory cells according to an embodiment of the present disclosure.

As discussed above, the present disclosure is directed to magnetoresistive or magnetoelectric memory devices including a high dielectric constant dielectric capping layer and/or a nonmagnetic metal dust layer between the free layer and the dielectric capping layer, and methods of making and programming the same, the various aspects of which are described below.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" refers to a layer that has a predominant direction of extension, i.e., having a direction along which the layer extends the most.

Referring to FIG. 1, a schematic diagram is shown for a magnetoresistive or magnetoelectric random access memory (RAM) device 500 including memory cells 180 of any embodiment of the present disclosure in an array configuration. The RAM device 500 includes an array of memory cells 180, which may be configured as a two-dimensional array or as a three-dimensional array. As used herein, a "random access memory" (RAM) refers to a memory device containing memory cells that allow random access, e.g., access to any selected memory cell upon a command for reading the contents of the selected memory cell. The RAM device 500 of the embodiment of the present disclosure is a random access memory device including a magnetoresistive or magnetoelectric memory element within each memory cell.

The RAM device 500 of an embodiment of the present disclosure includes a memory array region 550 containing an array of memory cells 180 located at the intersection of the respective word lines (which may comprise electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). Each of the memory cells 180 can be a two terminal memory cell including a respective first electrode and a respective second electrode. In one embodiment, the first electrodes can be connected to the first electrically conductive lines 30, and the second electrodes can be connected to the second electrically conductive lines 90. Alternatively, the first electrodes can be connected to the second electrically conductive lines 90, and the first electrodes can be connected to the first electrically conductive lines 30.

The RAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the memory cells 180 are provided in an array configuration that forms the RAM device 500. It should be noted that the location and interconnection of elements are schematic and the elements may be arranged in a different configuration. Further, a memory cell 180 may be manufactured as a discrete device, i.e., a single isolated device.

Each memory cell 180 includes a magnetic tunnel junction having at least two different resistive states depending on the alignment of magnetizations of different magnetic material layers. The magnetic tunnel junction is provided between a first electrode and a second electrode within each memory cell 180 In the first and second embodiments, the RAM device 500 comprises a VCMA magnetoelectric RAM ("MeRAM") device, and each memory cell 180 can be a voltage controlled magnetic anisotropy (VCMA) magnetoelectric memory cell in which the magnetization of the free layer can be controlled by an applied voltage. The magnetization may be programmed non-deterministically by timing the duration of a unipolar voltage pulse that induces precession in the free layer, and stopping the voltage pulse when the desired magnetization direction is achieved during the precession.

In the third and fourth embodiments, the RAM device 500 comprises a magnetoresistive RAM ("MRAM") device, and each memory cell 180 can be a spin-transfer torque (STT) magnetoresistive memory cell in which the magnetization of the free layer can be programmed deterministically by bidirectional spin-polarized current that tunnels through a magnetic tunnel junction.

The memory cells 180 of the embodiments present disclosure employ at least one of a voltage controlled magnetic anisotropy (VCMA) dielectric capping layer in a VCMA MeRAM, a nonmagnetic metal dust layer located between a dielectric capping layer and the free layer in a VCMA MeRAM or an STT-MRAM, and/or a hafnium oxide capping layer in a STT-MRAM.

In a first embodiment, the VCMA dielectric capping layer includes a dielectric material having a dielectric constant greater than 10, such as 25 and greater, and the memory cell 180 includes a VCMA magnetoelectric memory cell. Preferably, the VCMA dielectric capping layer is thicker than the tunnel barrier layer and has a higher dielectric constant than the tunnel barrier layer. Thus, the VCMA dielectric capping layer moves the VCMA effect (i.e., the voltage induced electric field) to interface between the VCMA dielectric capping layer and the free layer, which enables the MgO tunnel barrier layer to remain relatively thin. Therefore, the VCMA dielectric capping layer enhances the VCMA effect in the MeRAM device without deteriorating the interface between the free layer and the tunnel barrier layer, and thus without degrading the tunnel magnetoresistance (TMR) of the MeRAM device.

In a second embodiment, a nonmagnetic metal dust layer located between the free layer and the dielectric capping layer can be used in a MeRAM device containing a VCMA magnetoelectric memory cell to enhance perpendicular magnetic anisotropy of free layer and to enhance the exchange coupling. The combination of a nonmagnetic metal dust layer and a VCMA dielectric capping layer may enhance the VCMA effect more than a standalone VCMA dielectric capping layer.

In a third embodiment, a nonmagnetic metal dust layer located between the free layer and the dielectric capping layer can be used in an MRAM device containing a spin-transfer torque (STT) magnetoresistive memory cell to enhance perpendicular magnetic anisotropy of free layer and to enhance the thermal stability of the STT magnetoresistive memory device.

In a fourth embodiment, a hafnium oxide layer can be used as a dielectric capping layer in an STT magnetoresistive memory cell. The hafnium oxide layer enhances the perpendicular magnetic anisotropy (PMA) of the free layer and hence to enhance thermal stability (which is known as delta in the art). The various embodiments of the present disclosure are described in further detail herebelow.

Referring to FIG. 2, a first exemplary magnetoelectric memory device according to a first embodiment of the present disclosure is illustrated, which comprises a magnetoelectric memory cell. The magnetoelectric memory cell may be employed as a memory cell 180 within the MRAM device 500 illustrated in FIG. 1. According to the embodiment of the present disclosure, the magnetoelectric memory cell of the first embodiment of the present disclosure may be a voltage controlled magnetic anisotropy (VCMA) magnetoelectric memory cell. The memory cell 180 can be formed on an insulating support 20 (which may include a silicon oxide layer), and can include a first electrode 32 that may be electrically connected to, or comprises, a portion of a first electrically conductive line 30 (such as a word line or a bit line) and a second electrode 92 that may be electrically connected to, or comprises, a portion of a second electrically conductive line 90 (such as a bit line or a word line).

The first exemplary magnetoelectric memory cell 180 includes a magnetic tunnel junction (MTJ) 140. The magnetic tunnel junction 140 includes a reference layer 132 (which may also be referred to as a "pinned" layer) having a fixed vertical magnetization, a nonmagnetic tunnel barrier layer 134, and the free layer 136 (which may also be referred to as a "storage" layer) having a magnetization direction that can be programmed. The reference layer 132 and the free layer 136 can be separated by the nonmagnetic tunnel barrier layer 134 (such as an MgO layer), and have a magnetization direction perpendicular to the interface between the free layer 136 and the nonmagnetic tunnel barrier layer 134.

In one embodiment, the reference layer 132 is located below the nonmagnetic tunnel barrier layer 134, while the free layer 136 is located above the nonmagnetic tunnel barrier layer 134. A voltage controlled magnetic anisotropy (VCMA) dielectric capping layer 148 may be formed on top of the free layer 136. However, in other embodiments, the reference layer 132 is located above the nonmagnetic tunnel barrier layer 134, while the free layer 136 is located below the nonmagnetic tunnel barrier layer 134, or the reference layer 132 and the free layer 136 may be located on opposite side of the nonmagnetic tunnel barrier layer 134. The free layer 136 may be programmed into a first magnetization (e.g., magnetization direction) that is parallel to the fixed vertical magnetization (e.g., magnetization direction) of the reference layer 132, and a second magnetization (e.g., magnetization direction) that is antiparallel to the fixed vertical magnetization (e.g., magnetization direction) of the reference layer 132.

The reference layer 132 can include either a Co/Ni or Co/Pt multilayer structure or any other material that have larger perpendicular magnetic anisotropy than the free layer 136. In one embodiment, the reference layer 132 can additionally include a thin non-magnetic layer comprised of tantalum or tungsten having a thickness in a range from 0.2 nm to 0.5 nm and a thin CoFeB layer (having a thickness in a range from 0.5 nm to 3 nm).

The nonmagnetic tunnel barrier layer 134 can include any tunneling barrier material such as an electrically insulating material, for example magnesium oxide. In one embodiment, the nonmagnetic tunnel barrier layer 134 comprises, and/or consists essentially of, magnesium oxide and has a thickness in a range from 0.5 nm to 1.5 nm, such as 0.8 nm to 1 nm.

In one embodiment, the reference layer 132 may be provided as a component within a synthetic antiferromagnetic structure (SAF structure) 120. The SAF structure 120 can include a hard (i.e., fixed) ferromagnetic layer 112 with fixed magnetization along a vertical direction, an antiferromagnetic coupling layer 114, and the reference layer 132 which remains adjacent to the nonmagnetic tunnel barrier layer 134. The antiferromagnetic coupling layer 114 has a thickness that induces a strong antiferromagnetic coupling between the reference layer 132 and the hard ferromagnetic layer 112, such that the antiferromagnetic coupling layer 114 can "lock in" the antiparallel alignment between the hard ferromagnetic layer 112 and the reference layer 132, which in turn "locks in" a particular (fixed) vertical direction of the magnetization of the reference layer 132. In one embodiment, the antiferromagnetic coupling layer can include ruthenium, iridium, or chromium, and can have a thickness in a range from 0.3 nm to 1 nm.

The free layer 136 includes a ferromagnetic material such as CoFeB, CoFe, Co, Ni, NiFe, or a combination thereof. If a CoFeB alloy is included in the free layer 136, then the atomic concentration of boron atoms within the CoFeB alloy may be in a range from 10% to 30% (such as 20%), the atomic concentration of cobalt atoms within the CoFeB alloy may be in a range from 10% to 40% (such as 15%), and the atomic concentration of Fe in the CoFeB layer may be in a range from 50% to 90% (such as 65%). Any impurity atom in the CoFeB alloy, if present, has an atomic concentration less than 1 parts per million. The CoFeB alloy may be deposited in the amorphous state on a crystalline MgO nonmagnetic tunnel barrier layer 134 which has a rocksalt crystal structure. During a subsequent anneal of the device, the CoFeB alloy crystallizes into a body-centered cubic crystal structure using the MgO layer as a crystallization template, while some or all of the boron atoms diffuse away from the interface with the MgO layer. Thus, a proximal portion of the free layer 136 that contacts the nonmagnetic tunnel barrier layer 134 may comprise a CoFe alloy or a CoFeB alloy having a body-centered cubic crystal structure, and may provide a coherent interface with the nonmagnetic tunnel barrier layer 134, particularly with MgO and a higher TMR. The thickness of the free layer 136 can be in a range from 0.5 nm to 2 nm, although lesser and greater thicknesses can also be employed.

As used herein, a "thickness" of any deposited film having a thickness less than 10 nm is the product of the deposition time and the deposition rate as measured by deposition of a thicker film that can be physically measured by optical methods or by scanning electron microscopy. The deposition rate can be calibrated independently on thicker films for each material. A single monolayer of a material has an equivalent thickness of the monolayer of the material. A material that forms a fraction of a monolayer has an equivalent thickness of the fraction times the thickness of the monolayer of the material. If the fraction is less than one, then the material is a discontinuous layer in which the equivalent thickness can be less than the thickness of the monolayer of the material. As used herein, a "sub-monolayer" refers to a film having an average thickness less than one monolayer (e.g., less than 0.5 nm thick). In embodiments of the present disclosure, a sub-monolayer film can be a discontinuous layer having openings therethrough or can be a collection of individual atoms or clusters of atoms that do not form a continuous layer depending on the fractional number of an atomic layer that is present therein.

An interface between a magnetic film and a nonmagnetic film can be magnetoelectric, i.e., can exhibit a magnetic property that is sensitive to the electric field in the nonmagnetic film. When some dielectric materials are in contact with, or in close proximity with, a ferromagnetic material, may cause the ferromagnetic material to exhibit the voltage controlled magnetic anisotropy (VCMA) effect within the ferromagnetic material. The VCMA effect refers to an effect in which the magnetic anisotropy of a ferromagnetic material depends on the electric field within a dielectric material in direct contact with, or in close proximity to, the ferromagnetic material. Generally, the VCMA effect is believed to be due to spin-dependent charge screening and electric field-induced modulation of the relative occupancy of d orbitals at an interface between a ferromagnetic material and a dielectric material.

According to the first embodiment of the present disclosure, a voltage controlled magnetic anisotropy (VCMA) dielectric capping layer 148 can be formed on the free layer 136. In one configuration of the first embodiment, the VCMA dielectric capping layer 148 is deposited directly on the free layer 136 and directly physically contacts the free layer 136 without any intervening layer in between. The VCMA dielectric capping layer 148 is a dielectric material layer that decreases the magnetic anisotropy in the free layer 136 when electrical field is present therein along a direction perpendicular to an interface with the free layer 136. In one embodiment, the VCMA dielectric capping layer 148 has a dielectric constant of greater than 10, such as 25 or more, such as 25 to 80,000, for example 25 to 150, to enhance the VCMA effect in the memory cell 180. The thickness of the VCMA dielectric capping layer 148 can be in a range from 1 nm to 10 nm, such as from 1.5 nm to 3 nm. In one configuration, the VCMA dielectric capping layer 148 can contact the free layer 136, i.e., can be in physical contact with a surface of the free layer 136.

Preferably, the VCMA dielectric capping layer 148 is thicker than the tunnel barrier layer 134, and has a higher dielectric constant than the tunnel barrier layer 134. This shifts the VCMA effect which controls the magnetization direction of the free layer from the interface between the free layer 136 and the tunnel barrier layer 134 to the interface between the free layer 136 and the VCMA dielectric capping layer 148. Thus, the TMR of the memory cell 180 may be maintained because the interface between the free layer 136 and the magnesium oxide tunnel barrier layer 134 is not degraded, while the VCMA effect in enhanced due to the higher dielectric constant of the VCMA dielectric capping layer 148.

According to an embodiment of the present disclosure, the dielectric material of the VCMA dielectric capping layer 148 includes a dielectric material having a dielectric constant of 10 or greater, such as 25 or greater, when having a thickness of 10 nm or less, such as 1 nm to 5 nm. While many dielectric materials provide a dielectric constant greater than 10 in a bulk state, some dielectric materials have a lower or higher dielectric constant in a thin film having a thickness of 10 nm or less. In one embodiment, the dielectric material of the VCMA dielectric capping layer 148 can be selected such that the dielectric material has a dielectric constant is 10 or greater when the VCMA dielectric capping layer 148 a thickness of 10 nm or less, such as a thickness in range from 1 nm to 5 nm.

According to an embodiment of the present disclosure, the dielectric material of the VCMA dielectric capping layer 148 can include, and/or can consist essentially of at least one transition-metal-containing dielectric metal oxide material. Such transition-metal-containing dielectric metal oxide materials tend to provide a dielectric constant greater than 10 at a thickness less than 10 nm. In one embodiment, the at least one transition-metal-containing dielectric metal oxide material includes a single material that is selected from, or a plurality of materials that are selected from, hafnium oxide, zirconium oxide, tantalum pentoxide, yttrium oxide, aluminum oxide, strontium titanate, barium titanate, barium strontium titanate, lead zirconate titante, lead lanthanum titanate, lead lanthanum titanate zirconate, lead lanthanum zirconate, bismuth ferrite, and calcium copper titanate. In one embodiment, the at least one transition-metal-containing dielectric metal oxide material comprises at least one ternary dielectric oxide material including two metallic elements. In one embodiment, the at least one ternary dielectric oxide material including two metallic elements comprises at least one dielectric material selected from $SrTiO_3$, $BaTiO_3$, and $BiFeO_3$.

In one embodiment, the dielectric material of the VCMA dielectric capping layer 148 can comprise, and/or can consist essentially of, a material that has a dielectric constant of 25 and higher, such strontium titanate, barium titanate, barium strontium titanate, lead zirconate titante, lead lanthanum titanate, lead lanthanum titanate zirconate, lead lanthanum zirconate, bismuth ferrite or calcium copper titanate (which is reported to have a dielectric constant of about 80,000). These materials may be stoichiometric (e.g., $SrTiO_3$, $BaTiO_3$, $(Sr_{1-x}Ba_x)TiO_3$, $BiFeO_3$, $CaCu_3Ti_4O_{12}$, etc.) or non-stoichiometric and may optionally include dopants. Generally, the dielectric material of the VCMA dielectric capping layer 148 can be selected such that the dielectric material produces the VCMA effect at the interface with the free layer 136 and has a dielectric constant of 10 or greater, such as 25 or greater in a film form in a thickness range from 1.2 nm to 10 nm, such as 2 nm to 5 nm.

In one embodiment, the voltage drop across the VCMA dielectric capping layer 148 can be greater than the voltage drop across the nonmagnetic tunnel barrier layer 134 during programming, i.e., writing. Ignoring the effect of the tunneling current, the ratio of the voltage drop across the VCMA dielectric capping layer 148 to the voltage drop across the nonmagnetic tunnel barrier layer 134 is approximately the same as the ratio of the thickness-to-dielectric constant ratio for the VCMA dielectric capping layer 148 to the thickness-to-dielectric constant ratio for the nonmagnetic tunnel barrier layer 134. A thickness-to-dielectric constant ratio refers to the ratio of the thickness of a dielectric layer to the dielectric constant of the dielectric layer. Thus, the thickness-to-dielectric constant ratio for the VCMA dielectric capping layer 148 can be greater than the thickness-to-dielectric constant ratio for the nonmagnetic tunnel barrier layer 134.

A nonmagnetic metallic material can be provided on the side of the VCMA dielectric capping layer 148 that faces away from the free layer 136. For example, a nonmagnetic conductive capping layer 170 can be formed directly on the VCMA dielectric capping layer 148. The nonmagnetic conductive capping layer 170 includes at least one non-magnetic electrically conductive material such as tantalum, ruthenium, tantalum nitride, copper, and/or copper nitride. For example, the nonmagnetic conductive capping layer 170 can comprise a single layer, such as a single ruthenium layer, or a layer stack including, from one side to another, a first ruthenium layer, a tantalum layer, and a second ruthenium layer. For example, the first ruthenium layer can have a thickness in a range from 0.5 nm to 1.5 nm, the tantalum layer can have a thickness in a range from 1 nm to 3 nm, and the second ruthenium layer can have a thickness in a range from 0.5 nm to 1.5 nm. Optionally, the nonmagnetic conductive capping layer 170 may include an additional non-magnetic electrically conductive material, such as W, Ti, Ta, WN, TiN, TaN, Ru, and Cu. The thickness of such an additional non-magnetic electrically conductive material can be in a range from 1 nm to 30 nm, although lesser and greater thicknesses can also be employed. The second electrode 92 can be formed over the nonmagnetic conductive capping layer 170 as a portion of a second electrically conductive line 90.

The layer stack including the SAF structure 120, the magnetic tunnel junction 140, the VCMA dielectric capping layer 148, and the nonmagnetic conductive capping layer 170 can be annealed to induce crystallographic alignment between the crystalline structure of the nonmagnetic tunnel barrier layer 134 (which may include crystalline MgO having a rock salt crystal structure) and the crystalline structure of the free layer 136.

The location of the first electrode 32 and the second electrode 92 may be switched such that the second electrode 92 is electrically connected to the SAF structure 120 and the first electrode 32 is electrically connected to the nonmagnetic conductive capping layer 170. The layer stack including the material layers from the SAF structure 120 to the nonmagnetic conductive capping layer 170 can be deposited in reverse order, i.e., from the SAF structure 120 toward the nonmagnetic conductive capping layer 170 or from the nonmagnetic conductive capping layer 170 toward the SAF structure 120. The layer stack can be formed as a stack of continuous layers, and can be subsequently patterned into discrete patterned layer stacks for each memory cell 180.

Optionally, each memory cell 180 can include a dedicated steering device, such an access transistor (not shown) or a diode configured to activate a respective discrete patterned layer stack (120, 140, 148, 170) upon application of a suitable voltage to the steering device. The steering device may be electrically connected between the patterned layer stack and one of the first electrically conductive lines 30 or one of the second electrically conductive lines 90.

In one embodiment, the reference layer 132 has a fixed vertical magnetization that is perpendicular to an interface between the reference layer 132 and the nonmagnetic tunnel barrier layer 134. The free layer 136 has perpendicular magnetic anisotropy to provide bistable magnetization states that include a parallel state having a magnetization that is parallel to the fixed vertical magnetization and an antiparallel state having a magnetization that is antiparallel to the fixed vertical magnetization.

The memory cell 180 can be programmed employing the voltage controlled magnetic anisotropy (VCMA) effect. Thus, the memory cell 180 can be programmed employing an electrical voltage that is applied in one direction. In other words, a voltage is applied between a selected word line and a selected bit line, and the memory cell 180 can be toggled back and forth between the parallel and anti-parallel states by pulsing a voltage in one direction (e.g., in forward bias mode). In one embodiment, a very small current may flow between the free layer 136 and the reference layer 132 during the writing step. However, the current is typically so small that spin-transfer torque (STT) effects can be ignored, and Ohmic dissipation should be minimal which reduces the write power. Optionally, an in-plane ancillary magnetic field may be provided by an external field source 60 configured to apply an in-plane ancillary magnetic field to the free layer 136.

A control circuit 401 provides a unipolar voltage between the first electrode 32 and the second electrode 92. The control circuit 401 may include one or more of, or all of, the various elements 560, 570, 580 and/or 590 shown in FIG. 1. The control circuit 401 can have two nodes that are connected to a respective one of the first electrode 32 and the second electrode 92 via a respective first electrically conductive line 30 and a respective second electrically conductive line 90.

Generally, the control circuit 401 can be configured to perform a programming operation by applying a programming pulse to a selected VCMA magnetoelectric memory cell within the VCMA magnetoelectric memory device. The programming pulse has a same polarity (i.e., the first polarity) for a first magnetization state (i.e., a parallel alignment state) in which a free layer 136 and a reference layer 132 in the selected VCMA magnetoelectric memory cell have parallel magnetization directions, and for a second magnetization state (i.e., an antiparallel alignment state) in which the free layer 136 and the reference layer 132 in the selected VCMA magnetoelectric memory cell have antiparallel magnetization directions. The control circuit 401 can be configured to select a target VCMA magnetoelectric memory cell to be programmed within the VCMA magnetoelectric memory device, to determine an alignment state of magnetization of a free layer 136 (e.g., by reading the memory cell) and to apply a programming pulse if the alignment state of the target VCMA magnetoelectric memory cell is opposite to a target alignment configuration for the target VCMA magnetoelectric memory cell (thus, necessitating flipping of the magnetization of the free layer 136), and not to apply any programming pulse if the alignment state of the target VCMA magnetoelectric memory cell is in the target alignment configuration for the target VCMA magnetoelectric memory cell.

The programming pulse generates an electric field in the VCMA capping dielectric layer 148 and induces precession of a magnetization of a free layer 136 around an axis determined by magnetostatic interactions of various magnetic layers and the external magnetic field. In one embodiment, the programming pulse can be terminated when the polar angle is within a range from 0 radian to $\pi/20$ or when the polar angle is within a range from $19\pi/20$ to $\pi$.

Figure 3A:
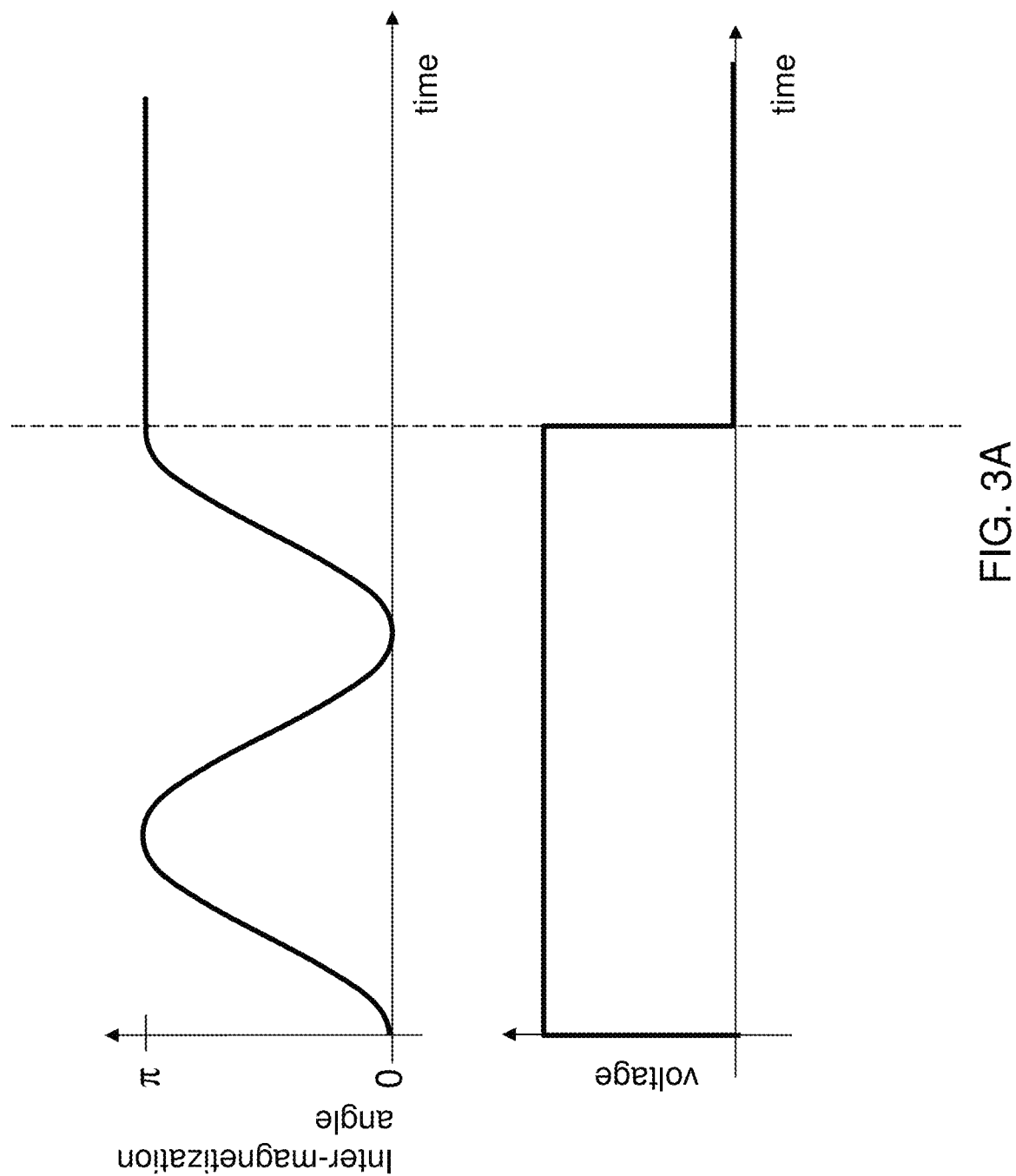
FIG. 3A illustrates a first exemplary programming pulse pattern for switching a magnetization state of a free layer from a parallel state to an antiparallel state according to the first embodiment of the present disclosure.

Referring to FIG. 3A, an example of a programming step is illustrated, in which a selected VCMA magnetoelectric memory cell 180 in a parallel alignment state is programmed into an antiparallel alignment state by a programming pulse of the first polarity that terminates when the polar angle between the magnetization direction of the free layer 136 with respect to the fixed magnetization direction of the reference layer 132 is within a range from $19\pi/20$ to $\pi$. The duration of the programming pulse may be in range from 0.02 ns to 0.5 ns, although lesser and greater duration of the programming pulse can also be employed.

Figure 3B:
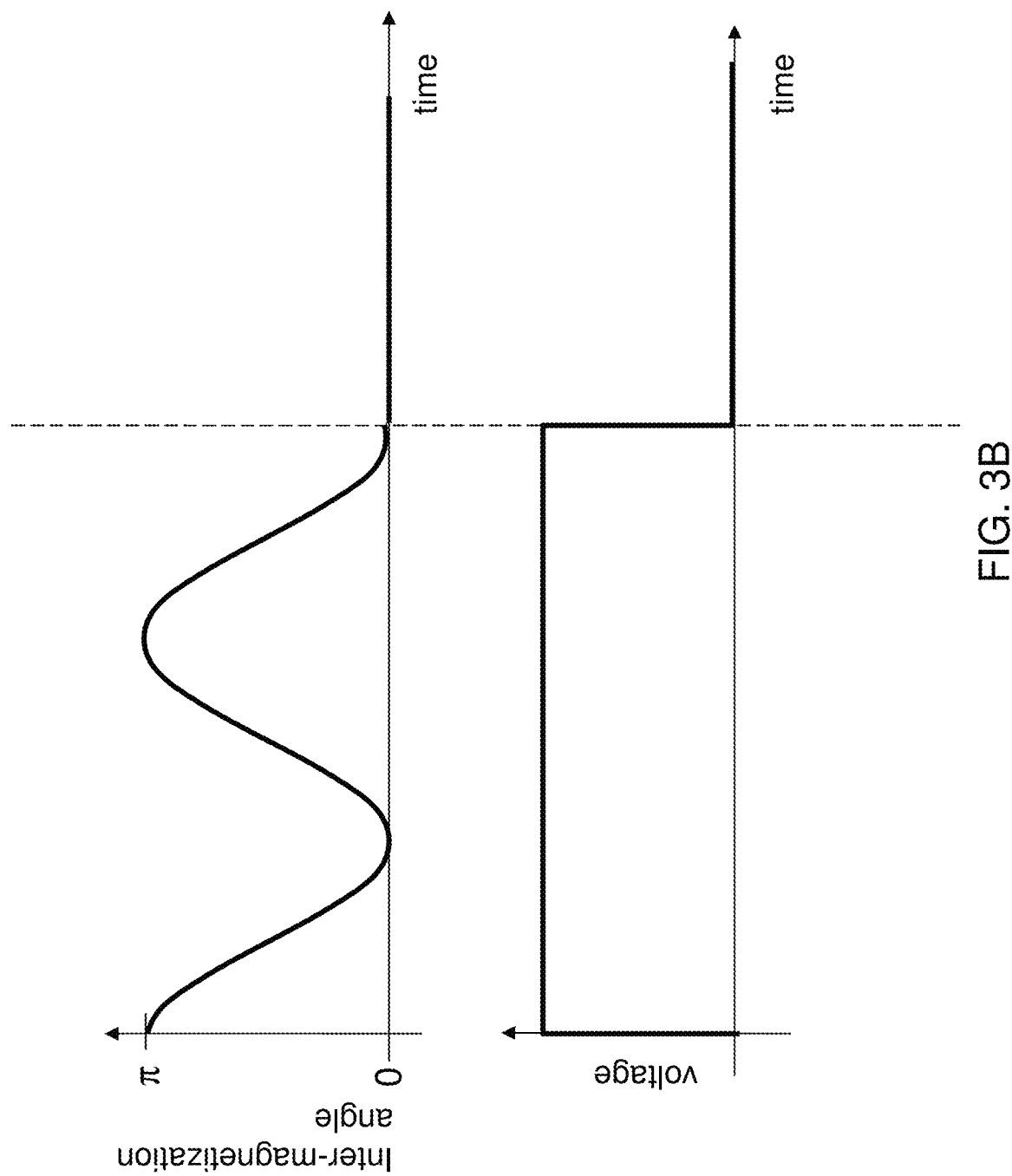
FIG. 3B illustrates a second exemplary programming pulse pattern for switching a magnetization state of a free layer from an antiparallel state to a parallel state according to the first embodiment of the present disclosure.

Referring to FIG. 3B, an example of a programming step is illustrated, in which a selected VCMA magnetoelectric memory cell in an antiparallel alignment state is programmed into a parallel alignment state by a programming pulse of the first polarity that terminates when the polar angle between the magnetization direction of the free layer 136 with respect to the fixed magnetization direction of the reference layer 132 is within a range from 0 to $\pi/20$.

Thus, the control circuit 401 is configured to perform a programming operation by applying a programming voltage between the first electrode 32 and the second electrode 92, wherein the programming voltage has a same polarity for a first magnetization state in which the free layer 136 and the reference layer 132 have parallel magnetization directions and for a second magnetization state in which the free layer and the reference layer have antiparallel magnetization directions. The magnitude of the programming voltage may be in a range from 500 mV to 3 V. The control circuit 401 is also configured to perform a sensing (i.e., reading) operation by applying a voltage between 100 mV and 1.5 V between the first and second electrodes.

A method of operating the memory cell 180 of the first embodiment comprises applying a first programming voltage of a first polarity between the first and the second electrodes (32, 92) to switch a first magnetization state of the free layer 136 in which the free layer and the reference layer 132 have parallel magnetization directions to a second magnetization state of the free layer in which the free layer and the reference layer have antiparallel magnetization directions. The method further comprises applying a second programming voltage of the first polarity between the first and the second electrodes to switch the second magnetization state of the free layer to the first magnetization state of the free layer. The first programming voltage and the second programming voltage generate an electric field in the VCMA dielectric capping layer which induces precession in the free layer 136. As shown in FIGS. 3A and 3B, the method includes terminating the first programming voltage when the free layer has the first magnetization direction, and terminating the second programming voltage when the free layer has the second magnetization direction. In one embodiment, an external magnetic field is optionally applied by source 60 during the step of applying the first programming voltage.

The magnetoelectric memory device of FIG. 2 can be manufactured by forming a layer stack including, from one side to another, a first electrode 32, a reference layer 132, a nonmagnetic tunnel barrier layer 134, a free layer 136, a voltage controlled magnetic anisotropy (VCMA) dielectric capping layer 148 having a dielectric constant greater than 10, and a second electrode 92 in a forward order or in a reverse order. A control circuit 401 can be formed, and the first electrode 32 and the second electrode 92 can be connected to a respective node of the control circuit 401. The reference layer 132 has a fixed magnetization direction, and the free layer 136 has magnetic anisotropy that provides magnetization directions that are parallel or antiparallel to the fixed magnetization direction.

The high dielectric constant of the VCMA dielectric capping layer 148 enhances VCMA effect, which is measured in terms of a VCMA coefficient.

Figure 4:
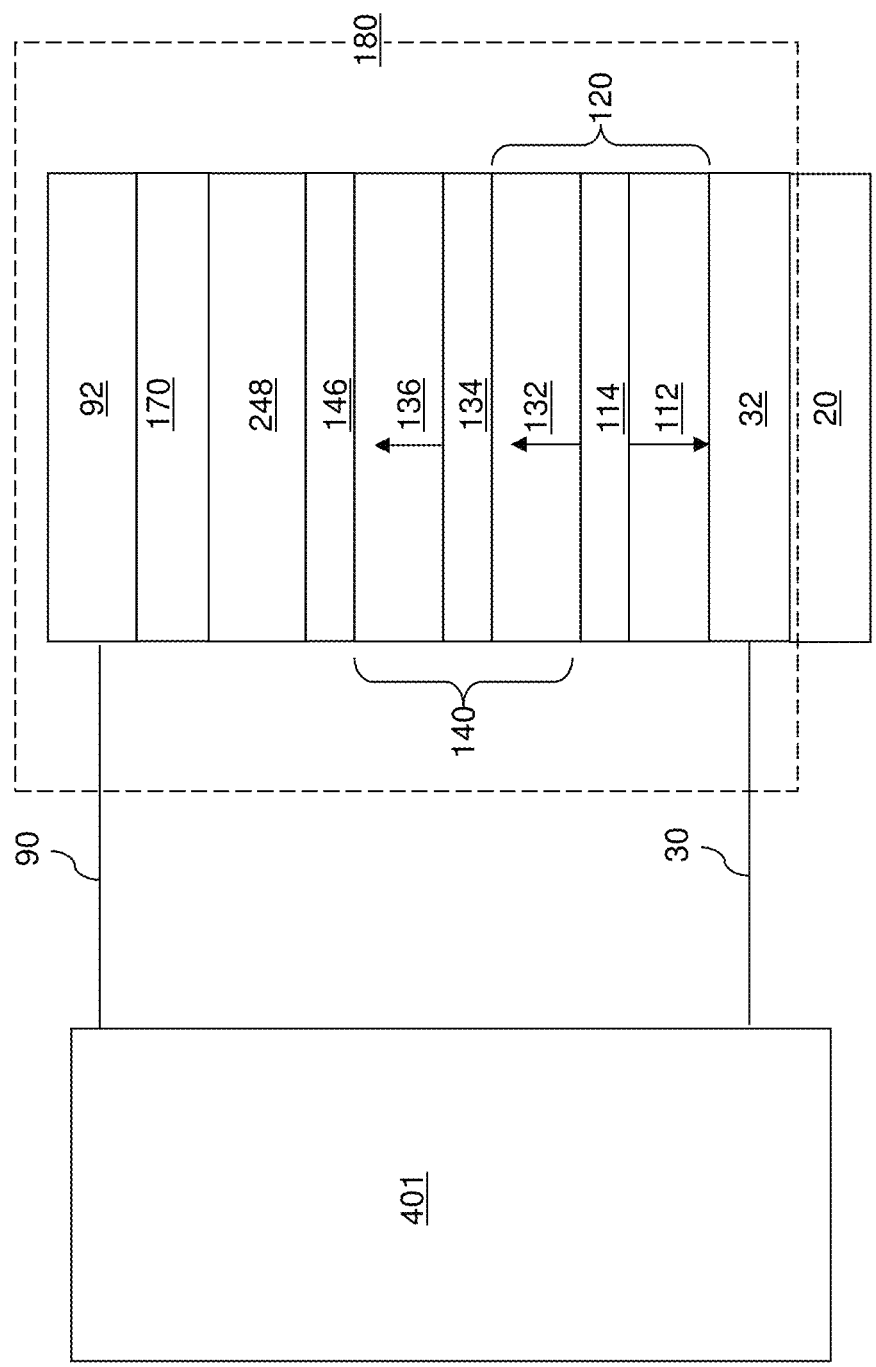
FIG. 4 illustrates a first configuration of a second exemplary memory device including a nonmagnetic metal dust layer according to a second embodiment of the present disclosure.

Referring to FIG. 4, a second exemplary memory device according to a second embodiment of the present disclosure is illustrated, which comprises a magnetoelectric memory cell, which may be a MeRAM cell, such as a VCMA MeRAM cell. The memory cell of the second embodiment may be employed as a memory cell 180 within the RAM device 500 illustrated in FIG. 1. The second exemplary memory cell of the second embodiment can be derived from the magnetoelectric memory cell of the first embodiment illustrated in FIG. 2 by replacing the VCMA dielectric capping layer 148 with a combination of a nonmagnetic metal dust layer 146 and a VCMA dielectric capping layer 248. The nonmagnetic metal dust layer 146 is located between the free layer 136 and the VCMA dielectric capping layer 248. The nonmagnetic metal dust layer 146 can be in contact with the surface of the free layer 136 which faces away from the nonmagnetic tunnel barrier layer 134, i.e., the surface of the free layer 136 that faces toward the second electrode 92.

In the second embodiment, any suitable dielectric capping material can be employed for the VCMA dielectric capping layer 248. The VCMA dielectric capping layer 248 may comprise any material that can be employed for the VCMA dielectric capping layer 148 of the first embodiment, or it may comprise a conventional VCMA dielectric capping layer, such as a magnesium oxide capping layer (which has a dielectric constant in a range from 6.8 to 9.8), or an aluminum oxide capping layer or even any insulating/semiconducting/dirty metallic layer. Thus, the nonmagnetic metal dust layer 146 may be located between the VCMA dielectric capping layer 248 and the free layer 136. The nonmagnetic metal dust layer 146 can contact the free layer 136 and the VCMA dielectric capping layer 248, and the VCMA dielectric capping layer 248 can contact the nonmagnetic conductive capping layer 170.

As used herein, a dust layer refers to a continuous layer or a non-continuous layer formed by deposition of at least one metal (e.g., nonmagnetic elemental metal) such that the thickness of the deposited metal does not exceed the thickness of five monolayers of the metal. In one embodiment, the dust layer of the second embodiment of the present disclosure is a sub-monolayer film having a thickness of less than one monolayer as described above. The nonmagnetic metal dust layer 146 of the second embodiment of the present disclosure can be deposited, for example, by physical vapor deposition of at least one nonmagnetic elemental metal. The nonmagnetic metal dust layer 146 of the second embodiment of the present disclosure can consist essentially of at least one elemental metal, i.e., a metallic element in an elemental form.

It is noted that the nonmagnetic metal dust layer 146 is formed on the side of the free layer 136 that faces away from the nonmagnetic tunnel barrier layer 134. Thus, the nonmagnetic metal dust layer 146 does not affect the tunneling characteristics of the magnetic tunnel junction 140. Instead, the nonmagnetic metal dust layer 146 is interposed between the free layer 136 and the VCMA dielectric capping layer 248. The nonmagnetic metal dust layer 146 provides the function of enhancing the VCMA effect.

In one embodiment, the material of the nonmagnetic metal dust layer 146 is selected such that the metal increases perpendicular magnetic anisotropy of the ferromagnetic alloy of the free layer 136. In one embodiment, the nonmagnetic metal dust layer 146 consists essentially of the at least one elemental metal, and the at least one elemental metal can be selected from Jr, Pd, Mg, Pt, W, Ta, Hf, Pd, Ru, or Rh. In one embodiment, the nonmagnetic metal dust layer 146 may consist essentially of single metal such as Ir, Pd, Mg, Pt, W, Ta, Hf, Pd, Ru, or Rh. In one embodiment, the nonmagnetic metal dust layer 146 may consist essentially of a single transition metal element such as Ir, Pd, Pt, W, Ta, Hf, Pd, Ru, or Rh. In another embodiment, the nonmagnetic metal dust layer 146 may consist essentially of Mg. The nonmagnetic metal dust layer 146 may be formed by physical vapor deposition (i.e., sputtering). The thickness of the nonmagnetic metal dust layer 146 can be less than 5 monolayers of the at least one elemental metal. In one embodiment, the thickness of the nonmagnetic metal dust layer 146 can be in a range from 0.1 nm to 1.2 nm, such as from 0.1 nm to 0.8 nm, and/or from 0.2 nm to 0.5 nm. In one embodiment, the nonmagnetic metal dust layer 146 has a sub-monolayer thickness and includes openings therethrough. In one embodiment, the nonmagnetic metal dust layer 146 is discontinuous, i.e., includes multiple clusters that do not contact one another. The number of metal atoms in each cluster may be in a range from 1 to 100. In this case, the thickness of the nonmagnetic metal dust layer 146 may be in a range from 0.1 nm to 0.2 nm. Alternatively, the nonmagnetic metal dust layer 146 can have a thickness in a range from 1 monolayer of the at least one elemental metal and 5 monolayers of the at least one elemental metal.

The second exemplary memory device of the second embodiment of the present disclosure includes a magnetoelectric memory device. The operational principle of the second exemplary memory device can be the same as the operational principle of the first exemplary memory device. Depending on the defect density and the leakage current level through the VCMA dielectric capping layer 248, the thickness of the VCMA dielectric capping layer 248 can be in a range from 1 nm to 5 nm, such as from 1 nm to 2.5 nm. The VCMA dielectric capping layer 248 can contact the nonmagnetic metal dust layer 146, i.e., can be in physical contact with a surface of the nonmagnetic metal dust layer 146.

The dielectric oxide materials that can be used for the VCMA dielectric capping layer 248 include, but are not limited to, magnesium oxide, aluminum oxide, or any of the materials of the VCMA dielectric capping layer 148.

In one embodiment, the VCMA dielectric capping layer 248 can include magnesium oxide. In another embodiment, the VCMA dielectric capping layer 248 can include aluminum oxide or a transition metal oxide, such as tantalum oxide. In one embodiment, the VCMA dielectric capping layer 248 comprises, and/or consists essentially of, a dielectric material that can be used for the VCMA dielectric capping layer 148 of the first embodiment. In this case, the dielectric material of the VCMA dielectric capping layer 248 can be selected from hafnium oxide and a ternary dielectric oxide material including at least two metal elements. In one embodiment, the VCMA dielectric capping layer 248 consists essentially of hafnium oxide. In one embodiment, the VCMA dielectric capping layer 248 consists essentially of a material selected from $SrTiO_3$, $BaTiO_3$, or $BiFeO_3$.

In one embodiment, the VCMA dielectric capping layer 248 can have a thickness in a range from 1.0 nm to 5.0 nm, and the nonmagnetic tunnel barrier layer 134 comprises, and/or consists essentially of, magnesium oxide and has a thickness in a range from 0.6 nm to 1.2 nm. In one embodiment, the VCMA dielectric capping layer 248 has a dielectric constant greater than 10 within a thickness range from 1.0 nm to 5.0 nm.

A nonmagnetic metallic material can be provided on the side of the dielectric capping layer 348 that faces away from the free layer 136. For example, a nonmagnetic conductive capping layer 170 can be formed on the VCMA dielectric capping layer 248. The nonmagnetic conductive capping layer 170 can have the same material composition and/or the same thickness as in the first embodiment. The second electrode 92 can be formed over the nonmagnetic conductive capping layer 170 as a portion of a second electrically conductive line 90.

The layer stack including the SAF structure 120, the magnetic tunnel junction 140, the VCMA dielectric capping layer 248, and the nonmagnetic conductive capping layer 170 can be annealed to induce crystallographic alignment between the crystalline structure of the nonmagnetic tunnel barrier layer 134 (which may include crystalline MgO having a rock salt crystal structure) and the crystalline structure of the free layer 136.

As in the first embodiment, the location of the first electrode 32 and the second electrode 92 may be switched such that the second electrode 92 is electrically connected to the SAF structure 120 and the first electrode 32 is electrically connected to the nonmagnetic conductive capping layer 170. The layer stack including the material layers from the SAF structure 120 to the nonmagnetic conductive capping layer 170 can be deposited in reverse order, i.e., from the SAF structure 120 toward the nonmagnetic conductive capping layer 170 or from the nonmagnetic conductive capping layer 170 toward the SAF structure 120. The layer stack can be formed as a stack of continuous layers, and can be subsequently patterned into discrete patterned layer stacks for each memory cell 180.

Optionally, each memory cell 180 can include a dedicated steering device, such an access transistor (not shown) or a diode configured to activate a respective discrete patterned layer stack (120, 140, 136, 248, 170) upon application of a suitable voltage to the steering device. The steering device may be electrically connected between the patterned layer stack and one of the first electrically conductive lines 30 or one of the second electrically conductive lines 90.

A control circuit 401 can be provided to generate the bidirectional current flow between the first electrode 32 and the second electrode 92. The control circuit 401 can have the same functionality as in the first embodiment.

The second exemplary structure comprises magnetoelectric memory device. The magnetoelectric memory device comprises a first electrode 32, a second electrode 92, and a magnetic tunnel junction 140 located between the first electrode 32 and the second electrode 92. The magnetic tunnel junction 140 comprises a reference layer 132 having a fixed magnetization direction (which is one of the up direction and the down direction), a free layer 136 having magnetic anisotropy that provide bistable magnetization directions that are parallel or antiparallel to the fixed magnetization direction, and a nonmagnetic tunnel barrier layer 134 located between the reference layer 132 and the free layer 136. The magnetoelectric memory device also comprises a VCMA dielectric capping layer 248 located between the second electrode 92 and the free layer 136, and a nonmagnetic metal dust layer 146 contacting the dielectric capping layer 248 and the free layer 136.

The nonmagnetic metal dust layer 146 may consist essentially of the at least one elemental metal. In one embodiment, the at least one elemental metal can be selected from Jr, Pd, Mg, Pt, W, Ta, Hf, Pd, Ru, or Rh. In one embodiment, the nonmagnetic metal dust layer 146 can consist essentially of a single elemental metal selected from Jr, Pd, Mg, Pt, W, Ta, Hf, Pd, Ru, or Rh, for example Ir.

In one embodiment, the magnetoelectric memory device can comprise a synthetic antiferromagnet structure 120 comprising a hard ferromagnetic layer 112, an antiferromagnetic coupling layer 114, and the reference layer 132. The antiferromagnetic coupling layer 114 provides antiferromagnetic coupling between magnetization of the hard ferromagnetic layer 112 and magnetization of the reference layer 132. The hard ferromagnetic layer 112 can contact the first electrode 32.

In one embodiment, the nonmagnetic metal dust layer 146 has a thickness less than 5 monolayers of the at least one elemental metal. In one embodiment, the nonmagnetic metal dust layer 146 is discontinuous and has sub-monolayer thickness.

In one embodiment, the VCMA dielectric capping layer 248 comprises, and/or consists essentially of, a dielectric material selected from magnesium oxide, aluminum oxide, or a dielectric oxide of at least one transition metal. In another embodiment, the VCMA dielectric capping layer 248 comprises, and/or consists essentially of the voltage controlled magnetic anisotropy (VCMA) dielectric capping layer 148 of the first embodiment having a dielectric constant of 10 or greater, such as 25 or greater. The VCMA dielectric capping layer 248 has a thickness in a range from 1 nm to 10 nm, and the nonmagnetic tunnel barrier layer 134 comprises magnesium oxide and has a thickness in a range from 0.5 nm to 1.5 nm.

The magnetoelectric memory device of FIG. 4 can be manufactured by forming a layer stack including, from one side to another, a first electrode 32, a reference layer 132, a nonmagnetic tunnel barrier layer 134, a free layer 136, a nonmagnetic metal dust layer 146, a VCMA dielectric capping layer 248, and a second electrode 92 in a forward order or in a reverse order. A control circuit 401 can be formed, and the first electrode 32 and the second electrode 92 can be connected to a respective node of the control circuit 401.

The nonmagnetic metal dust layer 146 enhances VCMA effect, which is measured in terms of a VCMA coefficient.

Figure 5:
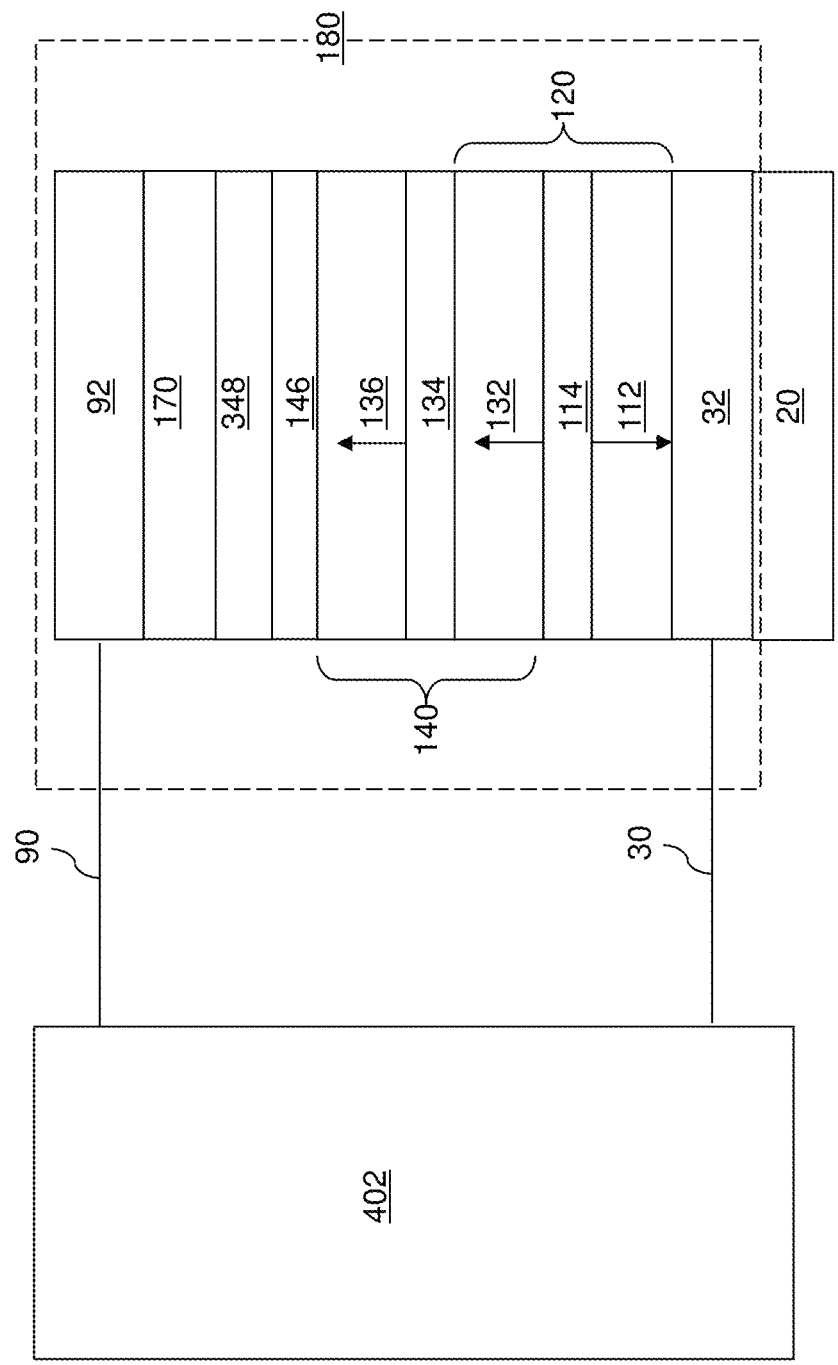
FIG. 5 illustrates a second configuration of the third exemplary memory device including a nonmagnetic metal dust layer according to a third embodiment of the present disclosure.

Referring to FIG. 5, a third exemplary memory device according to a third embodiment of the present disclosure is illustrated, which comprises a magnetoresistive memory cell, such as an STT-MRAM cell. The memory cell of the third embodiment may be employed as a memory cell 180 within the RAM device 500 illustrated in FIG. 1. The third exemplary memory cell of the third embodiment can be derived from the magnetoelectric memory cell of the first embodiment illustrated in FIG. 2 by replacing the VCMA dielectric capping layer 148 with a combination of a nonmagnetic metal dust layer 146 and a dielectric capping layer 348. The nonmagnetic metal dust layer 146 can be in contact with the surface of the free layer 136 which faces away from the nonmagnetic tunnel barrier layer 134, i.e., the surface of the free layer 136 that faces toward the second electrode 92. In contrast, in prior art spin-transfer torque magnetoresistive memory cells, a nonmagnetic metal dust layer is located between the free layer 136 and the nonmagnetic tunnel barrier layer 134.

In the third embodiment, any suitable dielectric capping layer 348 may be used. The dielectric capping layer 348 may comprise the same material as the dielectric capping layer 148 of the first embodiment (but having a smaller thickness), or it may comprise a conventional dielectric capping layer, such as a magnesium oxide capping layer (which has a dielectric constant in a range from 6.8 to 9.8), or an aluminum oxide capping layer or even any insulating/semiconducting/dirty metallic layer. Thus, the nonmagnetic metal dust layer 146 may be located between the dielectric capping layer 348 and the free layer 136. The nonmagnetic metal dust layer 146 can contact the free layer 136 and the dielectric capping layer 348, and the dielectric capping layer 348 can contact the nonmagnetic conductive capping layer 170.

It is noted that the nonmagnetic metal dust layer 146 is formed on the side of the free layer 136 that faces away from the nonmagnetic tunnel barrier layer 134. Thus, the nonmagnetic metal dust layer 146 does not affect the tunneling characteristics of the magnetic tunnel junction 140. Instead, the nonmagnetic metal dust layer 146 is interposed between the free layer 136 and the dielectric capping layer 348. The nonmagnetic metal dust layer 146 provides the function of enhancing the perpendicular magnetic anisotropy (PMA) of the free layer 136 in the STT MRAM device.

In one embodiment, the material of the nonmagnetic metal dust layer 146 is selected such that the metal increases perpendicular magnetic anisotropy of the ferromagnetic alloy of the free layer 136. In one embodiment, the nonmagnetic metal dust layer 146 consists essentially of the at least one elemental metal, and the at least one elemental metal can be selected from Jr, Pd, Mg, Pt, W, Ta, Hf, Pd, Ru, or Rh. In one embodiment, the nonmagnetic metal dust layer 146 may consist essentially of single metal such as Ir, Pd, Mg, Pt, W, Ta, Hf, Pd, Ru, or Rh. In one embodiment, the nonmagnetic metal dust layer 146 may consist essentially of a single transition metal element such as Ir, Pd, Pt, W, Ta, Hf, Pd, Ru, or Rh. In another embodiment, the nonmagnetic metal dust layer 146 may consist essentially of Mg. The nonmagnetic metal dust layer 146 may be formed by physical vapor deposition (i.e., sputtering). The thickness of the nonmagnetic metal dust layer 146 can be less than 5 monolayers of the at least one elemental metal. In one embodiment, the thickness of the nonmagnetic metal dust layer 146 can be in a range from 0.1 nm to 1.2 nm, such as from 0.1 nm to 0.8 nm, and/or from 0.2 nm to 0.5 nm. In one embodiment, the nonmagnetic metal dust layer 146 has a sub-monolayer thickness and includes openings therethrough. In one embodiment, the nonmagnetic metal dust layer 146 is discontinuous, i.e., includes multiple clusters that do not contact one another. The number of metal atoms in each cluster may be in a range from 1 to 100. In this case, the thickness of the nonmagnetic metal dust layer 146 may be in a range from 0.1 nm to 0.2 nm. Alternatively, the nonmagnetic metal dust layer 146 can have a thickness in a range from 1 monolayer of the at least one elemental metal and 5 monolayers of the at least one elemental metal.

The third exemplary memory device of the third embodiment of the present disclosure includes a STT magnetoresistive memory device in which electrical current flows between the first electrode 32 and the second electrode 92 during programming. Thus, the thickness of the dielectric capping layer 348 is within a range that allows tunneling of electrical current through the dielectric capping layer 348. Depending on the defect density and the leakage current level through the dielectric capping layer 348, the thickness of the dielectric capping layer 348 can be in a range from 0.2 nm to 1 nm. The dielectric capping layer 348 can contact the nonmagnetic metal dust layer 146, i.e., can be in physical contact with a surface of the nonmagnetic metal dust layer 146.

The dielectric oxide materials that can be used for the dielectric capping layer 348 include, but are not limited to, magnesium oxide, aluminum oxide, or any of the materials of the VCMA dielectric capping layer 148. The thickness of the dielectric capping layer 348 can be selected so that sufficient tunneling current flows through the dielectric capping layer 348 while tunneling current flows through the magnetic tunnel junction 140 during a programming operation or during a sensing (i.e., reading) operation.

In one embodiment, the dielectric capping layer 348 can include magnesium oxide. In another embodiment, the dielectric capping layer 348 can include aluminum oxide or a transition metal oxide, such as tantalum oxide. In one embodiment, the dielectric capping layer 348 comprises, and/or consists essentially of, a dielectric material that can be used for the VCMA dielectric capping layer 148 of the first embodiment. In this case, the dielectric material of the dielectric capping layer 348 can be selected from hafnium oxide or a ternary dielectric oxide material including at least two metal elements. In one embodiment, the dielectric capping layer 348 consists essentially of hafnium oxide. In one embodiment, the dielectric capping layer 348 consists essentially of a material selected from $SrTiO_3$, $BaTiO_3$, or $BiFeO_3$.

In one embodiment, the dielectric capping layer 348 can have a thickness in a range from 0.2 nm to 1 nm, and the nonmagnetic tunnel barrier layer 134 comprises, and/or consists essentially of, magnesium oxide and has a greater thickness in a range from 0.6 nm to 1.2 nm.

A nonmagnetic metallic material can be provided on the side of the dielectric capping layer 348 that faces away from the free layer 136. For example, a nonmagnetic conductive capping layer 170 can be formed on the dielectric capping layer 348. The nonmagnetic conductive capping layer 170 can have the same material composition and/or the same thickness as in the first embodiment. The second electrode 92 can be formed over the nonmagnetic conductive capping layer 170 as a portion of a second electrically conductive line 90.

The layer stack including the SAF structure 120, the magnetic tunnel junction 140, the dielectric capping layer 348, and the nonmagnetic conductive capping layer 170 can be annealed to induce crystallographic alignment between the crystalline structure of the nonmagnetic tunnel barrier layer 134 (which may include crystalline MgO having a rock salt crystal structure) and the crystalline structure of the free layer 136.

As in the first embodiment, the location of the first electrode 32 and the second electrode 92 may be switched such that the second electrode 92 is electrically connected to the SAF structure 120 and the first electrode 32 is electrically connected to the nonmagnetic conductive capping layer 170. The layer stack including the material layers from the SAF structure 120 to the nonmagnetic conductive capping layer 170 can be deposited in reverse order, i.e., from the SAF structure 120 toward the nonmagnetic conductive capping layer 170 or from the nonmagnetic conductive capping layer 170 toward the SAF structure 120. The layer stack can be formed as a stack of continuous layers, and can be subsequently patterned into discrete patterned layer stacks for each memory cell 180.

Optionally, each memory cell 180 can include a dedicated steering device, such an access transistor (not shown) or a diode configured to activate a respective discrete patterned layer stack (120, 140, 136, 348, 170) upon application of a suitable voltage to the steering device. The steering device may be electrically connected between the patterned layer stack and one of the first electrically conductive lines 30 or one of the second electrically conductive lines 90.

The magnetoresistive memory device of the third embodiment may comprise a spin-transfer torque (STT) magnetoresistive memory device configured to flow electrical current bidirectionally (i.e., in opposite direction) between the first electrode 32 and the second electrode 92 to deterministically program the memory cell 180 into two different resistivity states.

A control circuit 402 can be provided to generate the bidirectional current flow between the first electrode 32 and the second electrode 92. The control circuit 402 can have two nodes that are connected to a respective one of the first electrode 32 and the second electrode 92 via a respective first electrically conductive line 30 and a respective second electrically conductive line 90. Thus, the control circuit 402 can be configured to provide a positive programming voltage to the first electrode 32 relative to the second electrode 92, and to provide a negative programming voltage to the first electrode 32 relative to the second electrode 92.

In some embodiments, current flow from the reference layer 132 through the nonmagnetic tunnel barrier layer 134 and into the free layer 136 causes the magnetization of the free layer 136 to become parallel to the magnetization of the reference layer 132, and current flow from the free layer 136 through the nonmagnetic tunnel barrier layer 134 and into the reference layer 132 causes the magnetization of the free layer 136 to become antiparallel to the magnetization of the reference layer 132. In some other embodiments, the correlation between the current flow direction and the spin transfer direction may be the opposite.

The nonmagnetic metal dust layer 146 increases the perpendicular magnetic anisotropy of the free layer 136, and increases the thermal stability of the magnetization of the free layer 136.

Figure 6:
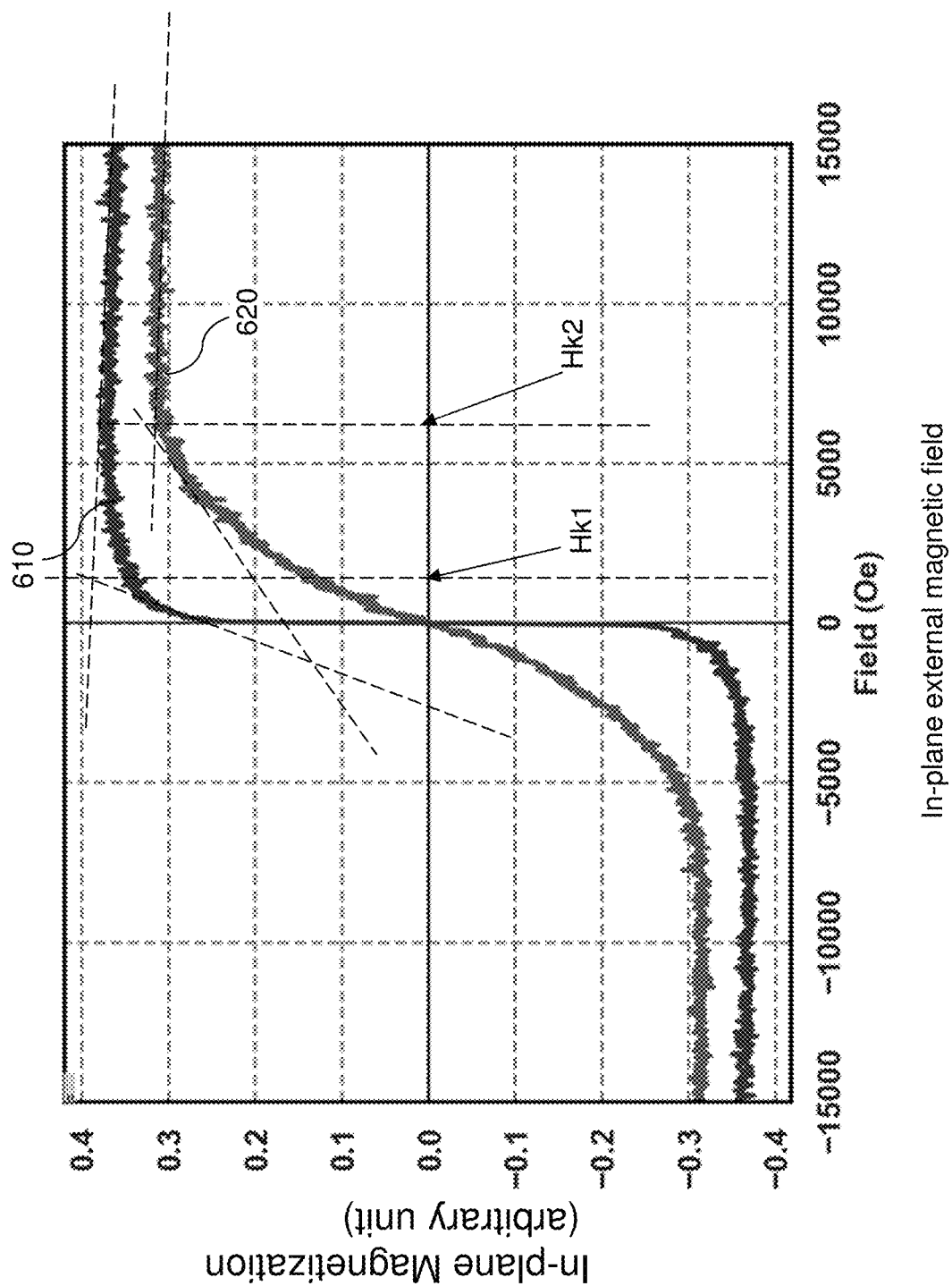
FIG. 6 illustrates the hard-axis in-plane magnetization vs. magnetic field loops of a free layer in a test structure according to the third exemplary memory device, and the hard-axis in-plane magnetization of a free layer in another test structure according to a first comparative exemplary memory device without a nonmagnetic metal dust layer as a function of an in-plane external magnetic field.

Referring to FIG. 6, measurement data for in-plane magnetization of a free layer 136 along a horizontal direction (i.e., an in-plane direction that is perpendicular to the interface between the free layer 136 and the nonmagnetic tunnel barrier layer 134) under an applied external magnetic field along the horizontal direction is shown for a test sample implementing an embodiment of the present disclosure illustrated in FIG. 5 in which the nonmagnetic metal dust layer 146 includes an iridium layer and the dielectric capping layer 348 includes a magnesium oxide, and for a comparative sample which is derived from the embodiment of the present disclosure in FIG. 5 by omitting the nonmagnetic metal dust layer 146 and by a magnesium oxide layer of the same thickness as the dielectric capping layer 348. The measurement data for the comparative sample is represented by a first curve 610. The measurement data for the test sample is represented by a second curve 620.

The first curve 610 shows a first critical magnetic field Hk1 of about 1,400 Oersted. The second curve 620 shows a second critical magnetic field Hk2 of about 6,200 Oersted. In the illustrated example, the nonmagnetic metal dust layer 146 of the second embodiment of the present disclosure can provide an enhancement in the critical magnetic field (Hk) for aligning the magnetization of the free layer 136 along an in-plane direction by a factor of 4 or greater, such as about $6,200/1,400 \cong 4.43$.

The magnitude of the critical magnetic field for aligning the magnetization of the free layer 136 along an in-plane direction is a measure of the perpendicular magnetic anisotropy of the free layer. As the test data in FIG. 6 illustrates, the nonmagnetic metal dust layer 146 of the second embodiment of the present disclosure that employs an iridium layer provides significant enhancement in the perpendicular magnetic anisotropy of the free layer 136 relative to the comparative example.

Referring back to FIG. 5, a magnetoresistive memory device is provided according to the third embodiment of the present disclosure. The magnetoresistive memory device comprises a first electrode 32, a second electrode 92, and a magnetic tunnel junction 140 located between the first electrode 32 and the second electrode 92.

The magnetic tunnel junction 140 comprises a reference layer 132 having a fixed magnetization direction (which is one of the up direction and the down direction), a free layer 136 having magnetic anisotropy that provide bistable magnetization directions that are parallel or antiparallel to the fixed magnetization direction, and a nonmagnetic tunnel barrier layer 134 located between the reference layer 132 and the free layer 136. The magnetoresistive memory device also comprises a dielectric capping layer 348 located between the second electrode 92 and the free layer 136, and a nonmagnetic metal dust layer 146 contacting the dielectric capping layer 348 and the free layer 136.

In one embodiment, the nonmagnetic metal dust layer 146 increases perpendicular magnetic anisotropy of the ferromagnetic material of the free layer 136. In one embodiment, the nonmagnetic metal dust layer 146 consists essentially of the at least one elemental metal. In one embodiment, the at least one elemental metal can be selected from Jr, Pd, Mg, Pt, W, Ta, Hf, Pd, Ru, or Rh. In one embodiment, the nonmagnetic metal dust layer 146 can consist essentially of a single elemental metal selected from Ir, Pd, Mg, Pt, W, Ta, Hf, Pd, Ru, or Rh, for example Ir.

In one embodiment, the magnetoresistive memory device can comprise a synthetic antiferromagnet structure 120 comprising a hard ferromagnetic layer 112, an antiferromagnetic coupling layer 114, and the reference layer 132. The antiferromagnetic coupling layer 114 provides antiferromagnetic coupling between magnetization of the hard ferromagnetic layer 112 and magnetization of the reference layer 132. The hard ferromagnetic layer 112 can contact the first electrode 32.

In one embodiment, the nonmagnetic metal dust layer 146 has a thickness less than 5 monolayers of the at least one elemental metal. In one embodiment, the nonmagnetic metal dust layer 146 is discontinuous and has sub-monolayer thickness.

In one embodiment, the dielectric capping layer 348 comprises, and/or consists essentially of, a dielectric material selected from magnesium oxide, aluminum oxide, or a dielectric oxide of at least one transition metal. In another embodiment, the dielectric capping layer 348 comprises, and/or consists essentially of the material of the voltage controlled magnetic anisotropy (VCMA) dielectric capping layer 148 of the first embodiment having a dielectric constant of 10 or greater, such as 25 or greater, but a smaller thickness. The dielectric capping layer 348 has a thickness in a range from 0.2 nm to 1 nm, and the nonmagnetic tunnel barrier layer comprises magnesium oxide and has a thickness in a range from 0.5 nm to 1.5 nm. Thus, the memory device comprises a spin-transfer torque (STT) magnetoresistive random access memory (MRAM) cell, in which the dielectric capping layer 348 has a thickness in a range from 0.2 nm to 1 nm, and the nonmagnetic tunnel barrier layer 134 comprises magnesium oxide and has a greater thickness in a range from 0.6 nm to 1.2 nm than the thickness of the dielectric capping layer 348.

The magnetoresistive memory device of FIG. 5 can be manufactured by forming a layer stack including, from one side to another, a first electrode 32, a reference layer 132, a nonmagnetic tunnel barrier layer 134, a free layer 136, a nonmagnetic metal dust layer 146, a dielectric capping layer 348, and a second electrode 92 in a forward order or in a reverse order. A control circuit 402 can be formed, and the first electrode 32 and the second electrode 92 can be connected to a respective node of the control circuit 402. The at least one elemental metal of the nonmagnetic metal dust layer 146 increases magnetic anisotropy of a ferromagnetic material within the free layer 136.

The nonmagnetic metal dust layer 146 enhances the perpendicular magnetic anisotropy in the free layer 136, which enhances thermal stability of the resistive states of the spin-transfer torque (STT) magnetoresistive memory device. The enhancement in the thermal stability of the resistive states is commonly referred to as delta in the art of magnetoresistive memory devices.

Figure 7:
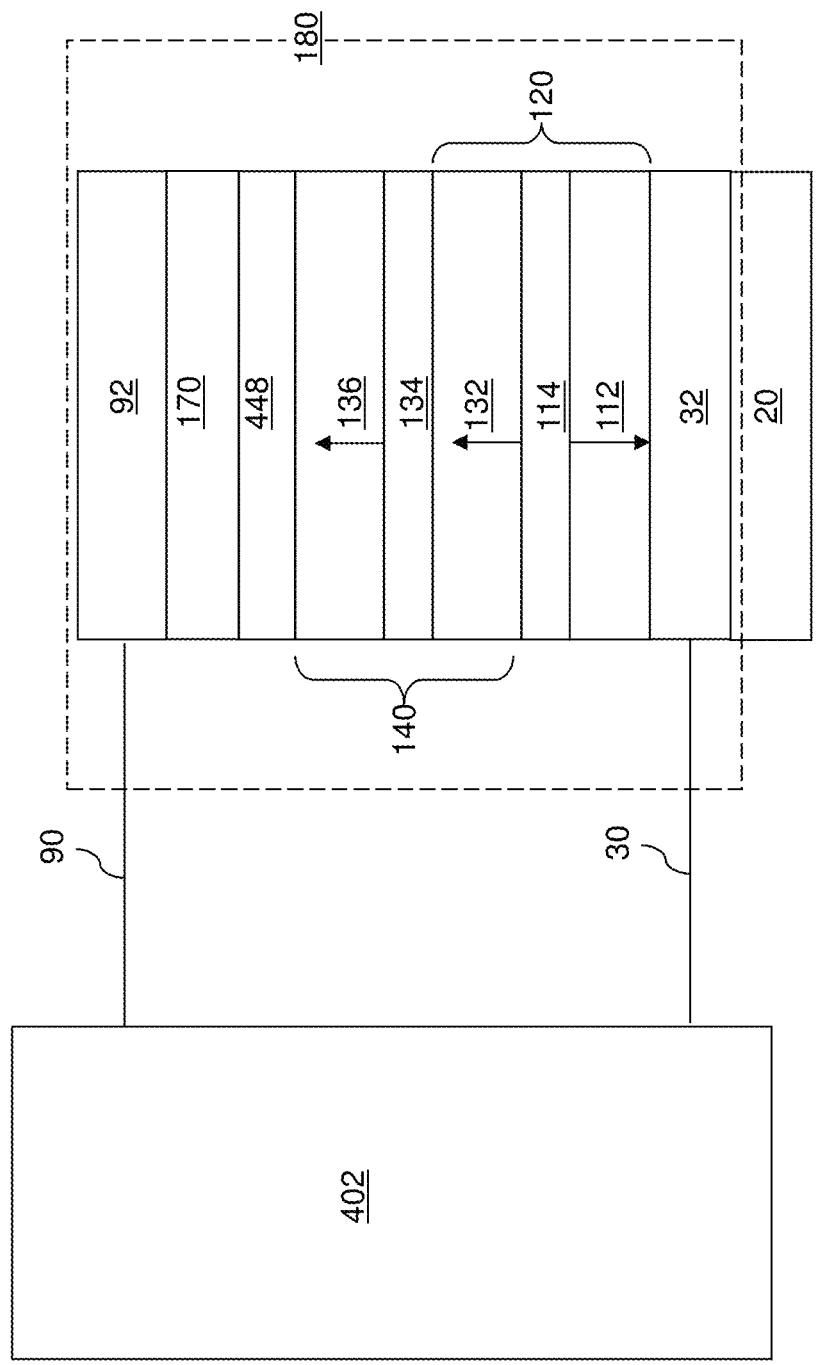
FIG. 7 illustrates a fourth exemplary memory device including a hafnium oxide capping layer according to a fourth embodiment of the present disclosure.

Referring to FIG. 7, a fourth exemplary memory device according to a fourth embodiment of the present disclosure is illustrated, which includes an STT magnetoresistive memory cell 180 that may be located within the RAM device 500 illustrated in FIG. 1. The fourth exemplary memory device can include an insulating support 20, such as a silicon oxide layer, a first electrode 32 that may be electrically connected to, or comprises, a portion of a first electrically conductive line 30 (such as a word line or a bit line) and a second electrode 92 that may be electrically connected to, or comprises, a portion of a second electrically conductive line 90 (such as a bit line or a word line).

The memory cell 180 of the fourth exemplary structure can be derived from the memory cell 180 of the second exemplary structure by replacing a combination of a nonmagnetic metal dust layer 146 and a dielectric capping layer 348 with a hafnium oxide layer (i.e., hafnium oxide dielectric capping layer) 448, or from the first exemplary structure by replacing the VCMA dielectric capping layer 148 with the hafnium oxide layer 448.

However, in this embodiment, the hafnium oxide layer 448 is preferably thinner than the magnesium oxide nonmagnetic tunnel barrier layer 134 such that the memory cell 180 is programmed by the STT effect by flowing a spin polarized tunnel current through both layers 134 and 448 in opposite direction. The control circuit 402 in the fourth exemplary structure can be the same as the control circuit 402 of the second embodiment. The external magnetic field source 60 is preferably omitted.

The fourth exemplary memory cell 180 includes a magnetic tunnel junction (MTJ) 140. The magnetic tunnel junction 140 includes a reference layer 132 (which may also be referred to as a "pinned" layer) having a fixed vertical magnetization, a nonmagnetic tunnel barrier layer 134, and the free layer 136 (which may also be referred to as a "storage" layer) having a magnetization direction that can be programmed. The reference layer 132 and the free layer 136 can be separated by the nonmagnetic tunnel barrier layer 134 (such as an MgO layer), and have a magnetization direction perpendicular to the interface between the free layer 136 and the nonmagnetic tunnel barrier layer 134.

In one embodiment, the reference layer 132 is located below the nonmagnetic tunnel barrier layer 134, and the free layer 136 is located above the nonmagnetic tunnel barrier layer 134. The hafnium oxide layer 448 can be formed on top of the free layer 136 in order to provide additional perpendicular anisotropy. Alternatively, the reference layer 132 is located above the nonmagnetic tunnel barrier layer 134, and the free layer 136 is located below the nonmagnetic tunnel barrier layer 134. Generally, the reference layer 132 and the free layer 136 may be located on opposite side of the nonmagnetic tunnel barrier layer 134. In one embodiment, the reference layer 132 and the free layer 136 have respective positive uniaxial magnetic anisotropy.

The configuration in which the reference layer 132 and the free layer 136 have respective perpendicular magnetic anisotropy provides bistable magnetization states for the free layer 136. The bistable magnetization states include a parallel state in which the free layer 136 has a magnetization (e.g., magnetization direction) that is parallel to the fixed vertical magnetization (e.g., magnetization direction) of the reference layer 132, and an antiparallel state in which the free layer 136 has a magnetization (e.g., magnetization direction) that is antiparallel to the fixed vertical magnetization (e.g., magnetization direction) of the reference layer 132.

A data bit can be written in the STT magnetoresistive memory cell by passing high enough electrical current through the reference layer 132 and the free layer 136 in a programming operation so that spin-transfer torque can set or reset the magnetization state of the free layer 136. The direction of the magnetization of the free layer 136 after the programming operation depends on the current polarity with respect to magnetization direction of the reference layer 132. The data bit can be read by passing smaller electrical current through the STT magnetoresistive memory cell and measuring the resistance of the STT magnetoresistive memory cell. The data bit "0" and the data bit "1" correspond to low and high resistance states of the STT magnetoresistive memory cell (or vice versa), which are provided by parallel or antiparallel alignment of the magnetization directions of the free layer 136 and the reference layer 132, respectively. The fractional resistance change between parallel (P) and antiparallel (AP) alignment (i.e., orientation) of the magnetization direction is called tunnel magnetoresistance (TMR), i.e., TMR=$(R_{AP}-R_P)/R_P$.

The reference layer 132 can include either a Co/Ni or Co/Pt multilayer structure or any other material that have larger perpendicular magnetic anisotropy than free layer. In one embodiment, the reference layer 132 can additionally include a thin non-magnetic layer comprised of tantalum or tungsten having a thickness in a range from 0.2 nm to 0.5 nm and a thin CoFeB layer (having a thickness in a range from 0.5 nm to 3 nm).

The nonmagnetic tunnel barrier layer 134 can include any tunneling barrier material such as an electrically insulating material, for example magnesium oxide. In one embodiment, the nonmagnetic tunnel barrier layer 134 comprises, and/or consists essentially of, magnesium oxide and has a thickness in a range from 0.6 nm to 1.2 nm, such as 0.8 nm to 1 nm. Generally, the thickness of a magnesium oxide layer as a nonmagnetic tunnel barrier layer 134 is sufficiently thin (e.g., below 1.2 nm) in order to permit electron tunneling therethrough during a program operation.

In one embodiment, the reference layer 132 may be provided as a component within a synthetic antiferromagnetic structure (SAF structure) 120. The SAF structure 120 can include a hard (i.e., fixed) ferromagnetic layer 112 with fixed magnetization along a vertical direction, an antiferromagnetic coupling layer 114, and the reference layer 132 which remains adjacent to the nonmagnetic tunnel barrier layer 134. The antiferromagnetic coupling layer 114 has a thickness that induces a strong antiferromagnetic coupling between the reference layer 132 and the hard ferromagnetic layer 112, such that the antiferromagnetic coupling layer 114 can "lock in" the antiparallel alignment between the hard ferromagnetic layer 112 and the reference layer 132, which in turn "locks in" a particular (fixed) vertical direction of the magnetization of the reference layer 132. In one embodiment, the antiferromagnetic coupling layer can include ruthenium, iridium, or chromium, and can have a thickness in a range from 0.3 nm to 1 nm.

The free layer 136 includes a ferromagnetic material such as CoFeB, CoFe, Co, Ni, NiFe, or a combination thereof. If a CoFeB alloy is included in the free layer 136, then the atomic concentration of boron atoms within the CoFeB alloy may be in a range from 10% to 30% (such as 20%), the atomic concentration of cobalt atoms within the CoFeB alloy may be in a range from 10% to 40% (such as 15%), and the atomic concentration of Fe in the CoFeB layer may be in a range from 50% to 90% (such as 65%). Any impurity atom in the CoFeB alloy, if present, has an atomic concentration less than 1 parts per million. The CoFeB alloy may be deposited in the amorphous state on the nonmagnetic tunnel barrier layer 134 including crystalline MgO, which has a rocksalt crystal structure. During a subsequent anneal of the device, the CoFeB alloy crystallizes into a body-centered cubic crystal structure using the MgO layer as a crystallization template, while some or all of the boron atoms diffuse away from the interface with the MgO layer.

Thus, a proximal portion of the free layer 136 that contacts the nonmagnetic tunnel barrier layer 134 may comprise a CoFe alloy or a CoFeB alloy having a body-centered cubic crystal structure, and may provide a coherent interface with the nonmagnetic tunnel barrier layer 134 and a higher TMR. The thickness of the free layer 136 can be in a range from 0.6 nm to 1.5 nm, although lesser and greater thicknesses can also be employed.

The hafnium oxide layer 448 can be formed on the free layer 136. In one configuration of the fourth embodiment, the hafnium oxide layer 448 is deposited directly on the free layer 136 and directly physically contacts the free layer 136 without any intervening layer in between. Thus, the hafnium oxide layer 448 can be in direct contact with the free layer 136 and can increase perpendicular magnetic anisotropy of the free layer 136. The hafnium oxide layer 448 can be deposited, for example, by physical vapor deposition, chemical vapor deposition, or atomic layer deposition. Alternatively, the nonmagnetic metal dust layer of the third embodiment may be located between the hafnium oxide layer 448 and the free layer 136.

In one embodiment, hafnium oxide layer consists essentially of hafnium oxide, such as undoped stoichiometric hafnium oxide. In another embodiment, the hafnium oxide layer 448 consists essentially of a doped hafnium oxide material including dopants at an atomic concentration less than 3%. The dopants may include at least one transition metal element such as Zr, Ti, Ta, Nb, or V.

The fourth exemplary memory device of the fourth embodiment of the present disclosure includes a STT magnetoresistive memory device in which electrical current flows between the first electrode 32 and the second electrode 92 through the nonmagnetic tunnel barrier layer 134 during a program operation. Thus, the thickness of the hafnium oxide layer 448 is within a range that allows tunneling of electrical current through the hafnium oxide layer 448.

Depending on the defect density and the leakage current level through the hafnium oxide layer 448, the thickness of the hafnium oxide layer 448 can be in a range from 0.2 nm to 1 nm, such as from 0.2 nm to 0.6 nm. In one configuration, the hafnium oxide layer 448 can contact the free layer 136, i.e., can be in physical contact with a surface of the free layer 136.

The nonmagnetic tunnel barrier layer 134 can comprise magnesium oxide having a thickness in a range from 0.5 nm to 1.5 nm. In one embodiment, the thickness of the hafnium oxide layer 448 can be less than the thickness of the nonmagnetic tunnel barrier layer 134. In one embodiment, the thickness-to-dielectric constant ratio of the hafnium oxide layer 448 can be less than the thickness-to-dielectric constant ratio of the nonmagnetic tunnel barrier layer 134. In other words, the ratio of the thickness-to-dielectric constant ratio of the hafnium oxide layer 448 to the thickness-to-dielectric constant ratio of the nonmagnetic tunnel barrier layer 134 can be less than 1.0. Ignoring the tunneling effects, the ratio of the voltage drop across the hafnium oxide layer 448 to the voltage drop across the nonmagnetic tunnel barrier layer 134 can be the same as the ratio of the thickness-to-dielectric constant ratio of the hafnium oxide layer 448 to the thickness-to-dielectric constant ratio of the nonmagnetic tunnel barrier layer 134. Thus, a greater voltage drop can be present across the nonmagnetic tunnel barrier layer 134 than across the hafnium oxide layer 448 during programming and sensing. In one embodiment, the ratio of the thickness-to-dielectric constant ratio of the hafnium oxide layer 448 to the thickness-to-dielectric constant ratio of the nonmagnetic tunnel barrier layer 134 may be in a range from 0.04 to 0.8, such as from 0.1 to 0.5. In one embodiment, the thickness of the hafnium oxide layer 448 can be less than the thickness of a monolayer of hafnium oxide, and may be in a range from one half of the thickness of a monolayer of hafnium oxide to the thickness of the monolayer of hafnium oxide. In this case, the hafnium oxide layer 448 can be discontinuous or formed with openings therethrough, and may form a porous framework including a plurality of openings therethrough. In another embodiment, the thickness of the hafnium oxide layer 448 can have a thickness greater than the thickness of a monolayer of hafnium oxide, and can be formed as a continuous material layer without openings therethrough or with openings having a total area that is less than 5% of the total area of the hafnium oxide layer 448.

A nonmagnetic metallic material can be provided on the side of the hafnium oxide layer 448 that faces away from the free layer 136. For example, a nonmagnetic conductive capping layer 170 can be formed directly on the hafnium oxide layer 448. The nonmagnetic conductive capping layer 170 includes at least one non-magnetic electrically conductive material such as tantalum, ruthenium, tantalum nitride, copper, and/or copper nitride. For example, the nonmagnetic conductive capping layer 170 can comprise a single layer, such as a single ruthenium layer, or a layer stack including, from one side to another, a first ruthenium layer, a tantalum layer, and a second ruthenium layer. For example, the first ruthenium layer can have a thickness in a range from 0.5 nm to 1.5 nm, the tantalum layer can have a thickness in a range from 1 nm to 3 nm, and the second ruthenium layer can have a thickness in a range from 0.5 nm to 1.5 nm. Optionally, the nonmagnetic conductive capping layer 170 may include an additional non-magnetic electrically conductive material, such as W, Ti, Ta, WN, TiN, TaN, Ru, and Cu. The thickness of such an additional non-magnetic electrically conductive material can be in a range from 1 nm to 30 nm, although lesser and greater thicknesses can also be employed. The second electrode 92 can be formed over the nonmagnetic conductive capping layer 170 as a portion of a second electrically conductive line 90.

The layer stack including the SAF structure 120, the magnetic tunnel junction 140, the hafnium oxide layer 448, and the nonmagnetic conductive capping layer 170 can be annealed to induce crystallographic alignment between the crystalline structure of the nonmagnetic tunnel barrier layer 134 (which may include crystalline MgO having a rock salt crystal structure) and the crystalline structure of the free layer 136.

The location of the first electrode 32 and the second electrode 92 may be switched such that the second electrode 92 is electrically connected to the SAF structure 120 and the first electrode 32 is electrically connected to the nonmagnetic conductive capping layer 170. The layer stack including the material layers from the SAF structure 120 to the nonmagnetic conductive capping layer 170 can be deposited in reverse order, i.e., from the SAF structure 120 toward the nonmagnetic conductive capping layer 170 or from the nonmagnetic conductive capping layer 170 toward the SAF structure 120. The layer stack can be formed as a stack of continuous layers, and can be subsequently patterned into discrete patterned layer stacks for each memory cell 180.

Optionally, each memory cell 180 can include a dedicated steering device, such an access transistor (not shown) or a diode configured to activate a respective discrete patterned layer stack (120, 140, 448, 170) upon application of a suitable voltage to the steering device. The steering device may be electrically connected between the patterned layer stack and one of the first electrically conductive lines 30 or one of the second electrically conductive lines 90.

In one embodiment, the magnetoresistive memory device of the fourth exemplary structure comprises a spin-transfer torque (STT) magnetoresistive memory device (e.g., a STT MRAM cell 180) configured to flow electrical current bidirectionally between the first electrode 32 and the second electrode 92.

In one embodiment, the reference layer 132 has a fixed vertical magnetization that is perpendicular to an interface between the reference layer 132 and the nonmagnetic tunnel barrier layer 134. The free layer 136 has perpendicular magnetic anisotropy to provide bistable magnetization states that include a parallel state having a magnetization that is parallel to the fixed vertical magnetization and an antiparallel state having a magnetization that is antiparallel to the fixed vertical magnetization. For the purpose of programming, the polarity of the voltage applied to the first electrode 32 with respect to the second electrode 92 can be selected depending on the target magnetization state of the free layer 136. For example, a voltage of a first polarity can be applied to the first electrode 32 (with respect to the second electrode 92) during a transition from an antiparallel state to a parallel state, and a voltage of a second polarity (which is the opposite of the first polarity) can be applied to the first electrode 32 during a transition from a parallel state to an antiparallel state.

A control circuit 402 can provide the bidirectional current flow between the first electrode 32 and the second electrode 92. The control circuit 402 may include one or more elements 560, 570, 580 and/or 590 shown in FIG. 1. The control circuit 402 can have two nodes that are connected to a respective one of the first electrode 32 and the second electrode 92 via a respective first electrically conductive line 30 and a respective second electrically conductive line 90. Thus, the control circuit 402 can be configured to provide a positive programming voltage to the first electrode 32 relative to the second electrode 92, and to provide a negative programming voltage to the first electrode 32 relative to the second electrode 92. Current flow from the reference layer 132 through the nonmagnetic tunnel barrier layer 134 and into the free layer 136 causes the magnetization of the free layer 136 to become parallel to the magnetization of the reference layer 132, and current flow from the free layer 136 through the nonmagnetic tunnel barrier layer 134 and into the reference layer 132 causes the magnetization of the free layer 136 to become antiparallel to the magnetization of the reference layer 132. In other words, a positive voltage applied to the second electrode 92 programs the free layer 136 into the parallel magnetization state, while a negative voltage applied to the second electrode 92 programs the free layer 136 into the antiparallel magnetization state. Thus, the alignment of the magnetization of the free layer 136 relative to the magnetization of the reference layer 132 during programming is deterministic, i.e., depends only on the polarity of the applied voltage to the first electrode 32 relative to the second electrode 92, and does not depend on the duration of the programming pulse.

In one embodiment, the control circuit 402 can be configured to apply a sensing voltage (i.e., read voltage) between the first electrode 32 and the second electrode 92. The sensing voltage may be positive or negative. The sensing voltage is selected such that flipping of the magnetization of the free layer 136 does not occur upon application of the sensing voltage. Thus, the sensing voltage has a magnitude that is less than a magnitude of the positive programming voltage and is less than a magnitude of the negative programming voltage. In one embodiment, the sensing voltage may be in a range from 50 mV to 500 mV, such as from 100 mV to 300 mV, although lesser and greater magnitudes can also be employed for the sensing voltage. In a non-limiting example, each of the positive programming voltage and the negative programming voltage can have a magnitude in a range from 100 mV to 1,500 mV, such as from 600 mV to 1,000 mV, and the sensing voltage can be in a range from 50 mV to 300 mV, such as from 100 mV to 200 mV.

The method of operating the STT MRAM cell 180 includes programming the MRAM cell into a first programmed state by applying a positive programming voltage to the second electrode relative to the first electrode, such that a magnetization direction of the free layer is parallel to a magnetization direction of the reference layer, and programming the MRAM cell into a second programmed state by applying a negative programming voltage to the second electrode relative to the first electrode, such that the magnetization direction in the free layer is antiparallel to the magnetization direction of the reference layer. The method further includes applying a sensing voltage to the first electrode relative to the second electrode, and determining a magnitude of electrical current that tunnels through the magnetic tunnel junction.

The hafnium oxide layer 448 enhances the perpendicular magnetic anisotropy in the free layer 136, which enhances thermal stability of the resistive states of the spin-transfer torque (STT) magnetoresistive memory device. The enhancement in the thermal stability of the resistive states is commonly referred to as delta in the art of magnetoresistive memory devices.

Figure 8:
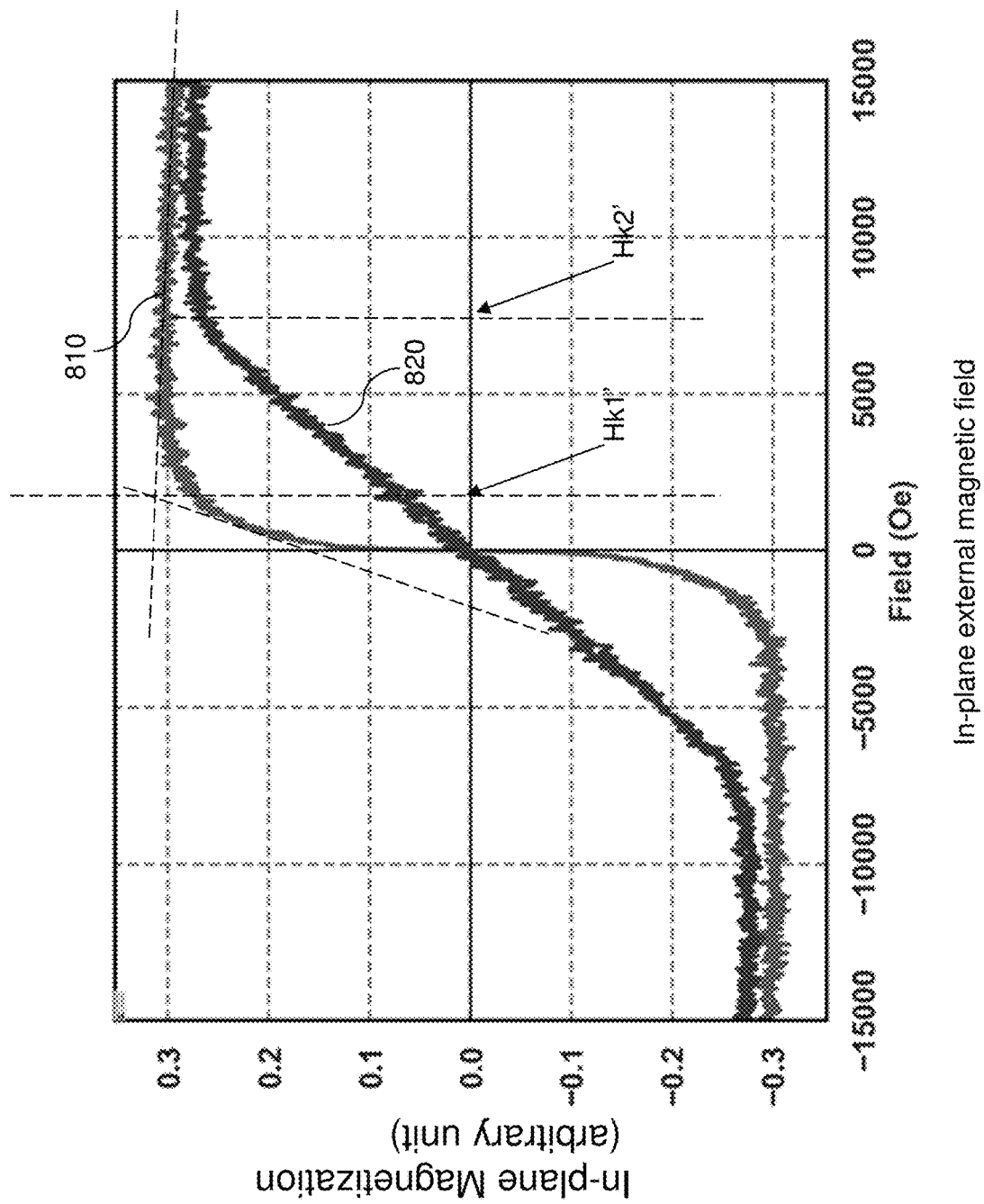
FIG. 8 illustrates the hard-axis in-plane magnetization vs. magnetic field loops of a free layer in a test structure according to the fourth exemplary memory device, and the in-plane magnetization of a free layer in another test structure according to a second comparative exemplary memory device employing a magnesium oxide capping layer as a function of an in-plane external magnetic field.

Referring to FIG. 8, in-plane magnetization of a free layer 136 along a horizontal direction (i.e., an in-plane direction that is perpendicular to the interface between the free layer 136 and the nonmagnetic tunnel barrier layer 134) under an applied external magnetic field along the horizontal direction is shown for a test sample implementing an embodiment of the present disclosure illustrated in FIG. 7 in which the dielectric capping layer is the hafnium oxide layer 448, and for a comparative sample which is derived from the fourth embodiment of the present disclosure in FIG. 7 by replacing the hafnium oxide layer 448 with a magnesium oxide dielectric capping layer having the same thickness. The measurement data for the comparative exemplary test is represented by a first curve 810. The measurement data for the test sample implementing an embodiment of the present disclosure illustrated in FIG. 7 is represented by a second curve 820.

The in-plane magnetization of a ferromagnetic film (such as a free layer 136) having perpendicular magnetic anisotropy is zero in the absence of any external in-plane magnetic field because the magnetization of the ferromagnetic film is along the vertical direction, i.e., the direction that is perpendicular to the major surfaces of the ferromagnetic film (such as an interface of the free layer 136 with a nonmagnetic tunnel barrier layer 134). As the magnitude of the in-plane external magnetic field increases, the angle between the magnetization of the magnetic film and the vertical direction gradually increases from 0 degree to a finite angle, and eventually becomes 90 degrees, which corresponds to the plateau regions in the graph of FIG. 8. The faster the increase (represented by a steep slope in the graph of FIG. 8) of the angle is with the magnitude of the in-plane external magnetic field, the less the magnetic anisotropy of the magnetic film, i.e., the magnetic film becomes easily disoriented from the preferred vertical magnetization directions even under a weak in-plane external magnetic field. In contrast, the more gradual the increase (represented by a smaller slope in the graph of FIG. 8) of the angle with the magnitude of the in-plane external magnetic field, the greater the magnetic anisotropy of the magnetic film, and the magnetic film remains aligned to a preferred vertical magnetization direction until strong external in-plane magnetic field is applied.

The first curve 810 shows a first critical magnetic field Hk1', which is the magnitude of the in-plane external magnetic field that needs to be applied to align the magnetization of the free layer along an in-plane direction (i.e., within a plane that is parallel to the interface between the free layer and the nonmagnetic tunnel barrier layer) in the comparative sample. Due to the asymptotic nature of the alignment of the magnetization of the free layer to the external magnetic field, the critical magnetic fields are estimated by determining an intersection point of two tangents from a flat portion and an adjoining sloped portion of a respective curve in FIG. 8. The first critical magnetic field Hk1' is about 1,600 Oersted. The second curve 820 shows a second critical magnetic field Hk2', which is the magnitude of the in-plane external magnetic field that needs to be applied to align the magnetization of the free layer along an in-plane direction in the test sample. The second critical magnetic field Hk2' is about 7,300 Oersted, which is more than three times greater than that of the comparative sample. The hafnium oxide layer 448 of the embodiment of the present disclosure can increase the critical magnetic field for aligning the magnetization of the free layer 136 along an in-plane direction by a factor which is greater than the ratio of the dielectric constant of the hafnium oxide layer 448 (which is about 25 to 30 for hafnium oxide depending on the quality and the thickness of the film) to the dielectric constant of magnesium oxide (which is in a range from 6.8 to 9.8 depending on the quality and the thickness of a magnesium oxide film). In the illustrated example, the factor can be about $7,300/1,600 \cong 4.56$.

The magnitude of the critical magnetic field for aligning the magnetization of the free layer 136 along an in-plane direction is a measure of the perpendicular magnetic anisotropy of the free layer as provided within a respective film stack of the test sample implementing an embodiment of the present disclosure or as provided within the comparative film stack. As the test data in FIG. 8 illustrates, the hafnium oxide layer 448 of the embodiment of the present disclosure provides significant enhancement in the perpendicular magnetic anisotropy of the free layer 136 (and thus, the exchange energy) compared to a magnesium oxide dielectric capping layer, without degrading the TMR of the STT MRAM cell 180. Specifically, the interface between the free layer 136 and the MgO tunneling barrier layer 134 is not degraded or altered in the fourth embodiment. Furthermore, the hafnium oxide dielectric capping layer 448 provides a better electric breakdown than a comparable magnesium oxide dielectric capping layer.

Without wishing to be bound by a particular theory, it is believed that during the application of a voltage across the hafnium oxide layer 448, the $2p$ orbitals of the oxygen atoms in hafnium oxide in contact with or in close proximity to a ferromagnetic iron alloy (such as a CoFeB alloy, a CoFe alloy, or a NiFe alloy) of the free layer 136, can hybridize with the $3d$ orbitals of the iron atoms to generate hybridized orbitals at the interface between the free layer 136 and the hafnium oxide layer 448. It is believed that this may induce precession in the ferromagnetic iron alloy of the free layer 136, and thus improve the PMA without degrading TMR.

The magnetoresistive memory device of FIG. 7 can be manufactured by forming on a semiconductor substrate a layer stack including, from one side to another, a first electrode 32, a reference layer 132, a nonmagnetic tunnel barrier layer 134, a free layer 136, a hafnium oxide layer 448, and a second electrode 92. The hafnium oxide layer 448 may be in direct contact with the free layer 136 and increases perpendicular magnetic anisotropy of the free layer 136. Alternatively, the nonmagnetic metal dust layer of the second embodiment may be formed between the free layer 136 and the hafnium oxide layer 448 to further improve the PMA.

A control circuit 402 can be formed, and the first electrode 32 and the second electrode 92 can be connected to a respective node of the control circuit 402. The control circuit 402 can be configured to provide a positive programming voltage to the first electrode 32 relative to the second electrode 92 to provide a first programmed state for the magnetoresistive memory device, to provide a negative programming voltage to the first electrode 32 relative to the second electrode 92 to provide a second programmed state for the magnetoresistive memory device, and to provide a sensing voltage to the first electrode 32 relative to the second electrode 92. The sensing voltage has a magnitude that is less than a magnitude of the positive programming voltage and is less than a magnitude of the negative programming voltage.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A voltage controlled magnetic anisotropy (VCMA) magnetoelectric memory device comprising a VCMA magnetoelectric memory cell, wherein the VCMA magnetoelectric memory cell comprises: a first electrode; a second electrode that is spaced from the first electrode; a magnetic tunnel junction located between the first electrode and the second electrode, the magnetic tunnel junction comprising a reference layer having a fixed magnetization direction, a free layer, and a nonmagnetic tunnel barrier layer located between the reference layer and the free layer; a voltage controlled magnetic anisotropy (VCMA) dielectric capping layer having a dielectric constant greater than 10 and located between the free layer and the second electrode; and wherein the VCMA dielectric capping layer is thicker than the nonmagnetic tunnel barrier layer and has a higher dielectric constant than the nonmagnetic tunnel barrier layer, such that an electric field is generated in the VCMA dielectric capping layer during the application of a voltage between the first electrode and the second electrode.

2. The VCMA magnetoelectric memory device of claim 1, wherein the VCMA dielectric capping layer consists essentially of at least one transition-metal-containing dielectric metal oxide material.

3. The VCMA magnetoelectric memory device of claim 2, wherein the at least one transition-metal-containing dielectric metal oxide material comprises at least one ternary dielectric oxide material including two transition metal elements.

4. The VCMA magnetoelectric memory device of claim 3, wherein the at least one ternary dielectric oxide material comprises $SrTiO_3$, $BaTiO_3$, or $BiFeO_3$.

5. The VCMA magnetoelectric memory device of claim 2, wherein the at least one transition-metal-containing dielectric metal oxide material consists essentially of hafnium oxide.

6. The VCMA magnetoelectric memory device of claim 1, wherein the VCMA dielectric capping layer has a thickness in a range from 1.0 nm to 10 nm.

7. The VCMA magnetoelectric memory device of claim 1, wherein the VCMA dielectric capping layer has a thickness in a range from 1 nm to 5 nm and a dielectric constant of 25 or greater.

8. The VCMA magnetoelectric memory device of claim 7, wherein the nonmagnetic tunnel barrier layer comprises magnesium oxide having a thickness in a range from 0.5 nm to 1.5 nm.

9. The VCMA magnetoelectric memory device of claim 1, further comprising an external magnetic field source configured to apply an ancillary magnetic field to the free layer.

10. The VCMA magnetoelectric memory device of claim 1, further comprising a synthetic antiferromagnet (SAF) structure comprising a stack of a hard ferromagnetic layer, an antiferromagnetic coupling layer, and the reference layer, the SAF structure being located between the first electrode and the nonmagnetic tunnel barrier layer.

11. The VCMA magnetoelectric memory device of claim 1, wherein the VCMA dielectric capping layer directly physically contacts the free layer.

12. The VCMA magnetoelectric memory device of claim 1, further comprising a nonmagnetic metal dust layer located between the VCMA dielectric capping layer and the free layer.

13. The VCMA magnetoelectric memory device of claim 1, further comprising a control circuit that is configured to perform a programming operation by applying a programming voltage between the first electrode and the second electrode, wherein the programming voltage has a same polarity for a first magnetization state in which the free layer and the reference layer have parallel magnetization directions and for a second magnetization state in which the free layer and the reference layer have antiparallel magnetization directions.

14. A method of programming the VCMA magnetoelectric memory device of claim 1, comprising applying a first programming voltage of a first polarity between the first electrode and the second electrode to switch a first magnetization state of the free layer in which the free layer and the reference layer have parallel magnetization directions to a second magnetization state of the free layer in which the free layer and the reference layer have antiparallel magnetization directions.

15. The method of claim 14, further comprising applying a second programming voltage of the first polarity between the first and the second electrodes to switch the second magnetization state of the free layer to the first magnetization state of the free layer.

16. The method of claim 15, wherein:
the first programming voltage and the second programming voltage generate an electric field in the VCMA dielectric capping layer which induces precession in the free layer; and
the first programming voltage has a magnitude in a range from 500 mV to 3 V.

17. The method of claim 16, further comprising terminating the first programming voltage when the free layer has the first magnetization direction.

18. The method of claim 17, further comprising terminating the second programming voltage when the free layer has the second magnetization direction.

19. The method of claim 14, further comprising applying an external magnetic field during the step of applying the first programming voltage.

* * * * *